United States Patent
Endres

(10) Patent No.: US 9,915,875 B2
(45) Date of Patent: Mar. 13, 2018

(54) ILLUMINATION OPTICAL ASSEMBLY FOR PROJECTION LITHOGRAPHY

(71) Applicant: Carl Zeiss SMT GmbH, Oberkochen (DE)

(72) Inventor: Martin Endres, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/439,616

(22) Filed: Feb. 22, 2017

(65) Prior Publication Data

US 2017/0160640 A1    Jun. 8, 2017

Related U.S. Application Data

(63) Continuation of application No. PCT/EP2015/069215, filed on Aug. 21, 2015.

(30) Foreign Application Priority Data

Sep. 3, 2014   (DE) .................. 10 2014 217 612

(51) Int. Cl.
    *G03B 27/54*    (2006.01)
    *G03F 7/20*    (2006.01)

(52) U.S. Cl.
    CPC .......... *G03F 7/702* (2013.01); *G03F 7/70033* (2013.01); *G03F 7/70075* (2013.01); *G03F 7/70091* (2013.01)

(58) Field of Classification Search
    CPC ... G03F 7/702; G03F 7/70075; G03F 7/70191
    (Continued)

(56) References Cited

U.S. PATENT DOCUMENTS 5,963,305 A * 10/1999 Mizouchi ............ G03F 7/70075
                                                     355/53
7,095,560 B2    8/2006  Toyoda et al.
(Continued)

FOREIGN PATENT DOCUMENTS

DE   10 2006 020 734 A1   11/2007
DE   10 2008 009 600 A1    8/2009
(Continued)

OTHER PUBLICATIONS

International Search Report and Written Opinion for corresponding PCT Appl No. PCT/EP2015/069215, dated Jan. 18, 2016.
(Continued)

*Primary Examiner* — Hung Henry Nguyen
(74) *Attorney, Agent, or Firm* — Fish & Richardson P.C.

(57) ABSTRACT

An illumination optical assembly for projection lithography serves for illuminating an illumination field, in which an object field of a downstream imaging optical assembly is arrangeable, with illumination light of an EUV light source. The illumination optical assembly has a pupil illumination unit, on which the illumination light impinges and which includes facets for illuminating a pupil in the illumination beam path with the illumination light with a predefined pupil intensity distribution. The pupil illumination unit is embodied such that a plurality of illumination channels of the pupil illumination unit illuminate only a part of the entire object field. This results in an illumination optical assembly in which an excessively high illumination intensity on the facets of the pupil illumination unit can be reduced.

20 Claims, 15 Drawing Sheets

(58) Field of Classification Search
USPC .............................................. 355/53, 67–71
See application file for complete search history.

(56) References Cited

U.S. PATENT DOCUMENTS

| | | |
|---|---|---|
| 2006/0132747 A1 | 6/2006 | Singer et al. |
| 2012/0069314 A1 | 3/2012 | Zellner et al. |
| 2014/0368803 A1* | 12/2014 | Patra .................. G02B 27/0927 355/67 |
| 2015/0002925 A1 | 1/2015 | Endres et al. |
| 2015/0153650 A1* | 6/2015 | Deguenther ....... G02B 26/0833 355/67 |
| 2016/0313646 A1 | 10/2016 | Dinger et al. |

FOREIGN PATENT DOCUMENTS

| | | |
|---|---|---|
| WO | WO 2005/015314 A2 | 2/2005 |
| WO | WO 2010/099807 A1 | 9/2010 |

OTHER PUBLICATIONS

German Office Action, with translation thereof, for corresponding DE Appl No. 10 2014 217 612.3, dated Feb. 26, 2015.

* cited by examiner

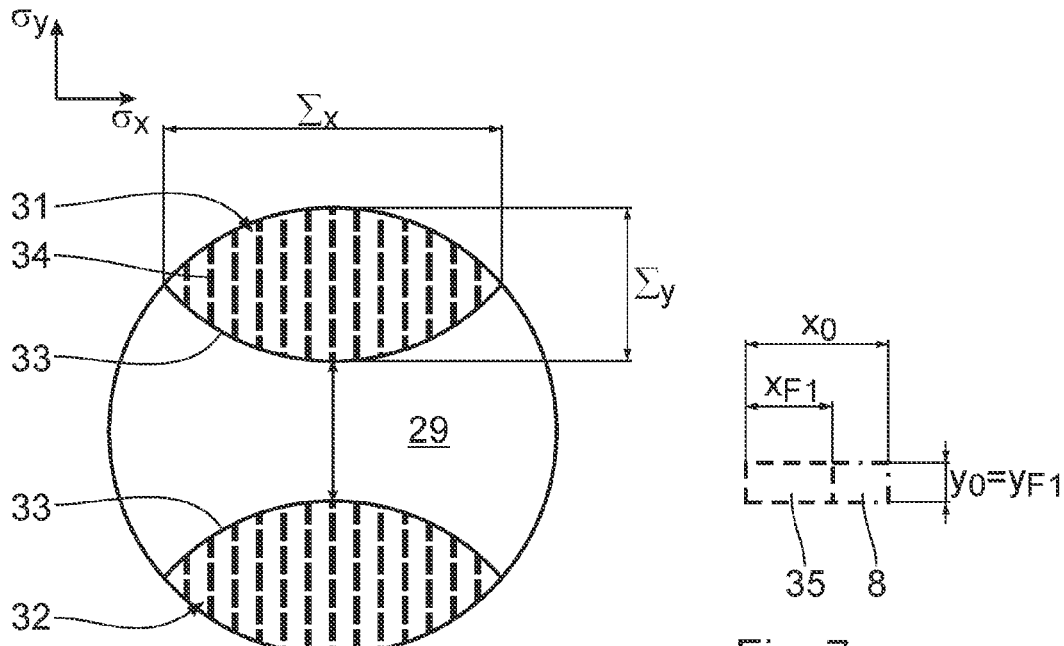
Fig. 6
Fig. 7
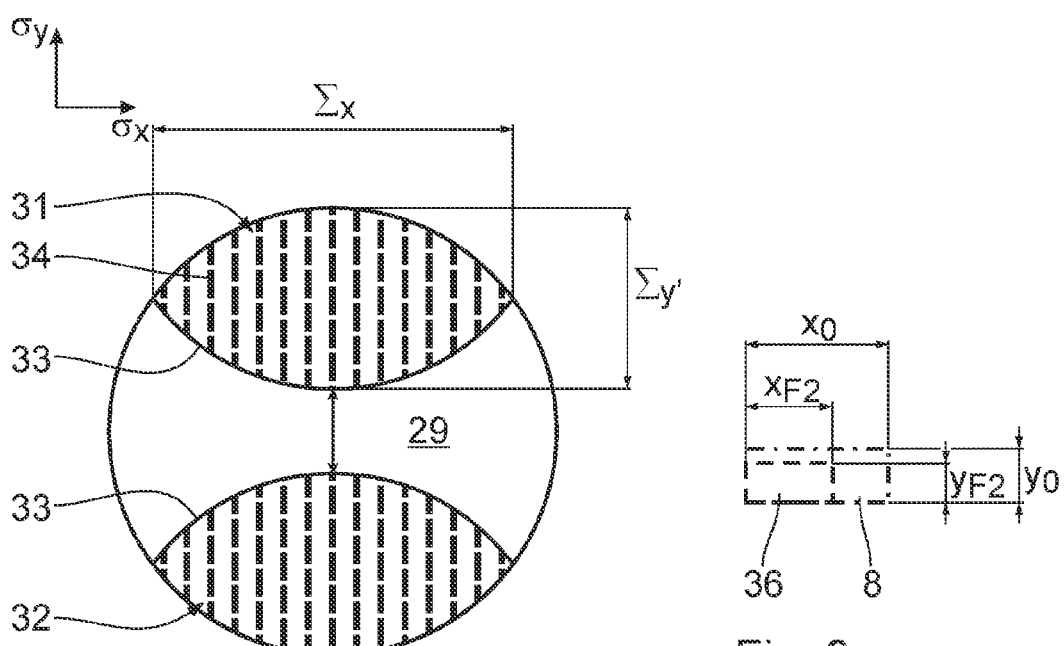
Fig. 8
Fig. 9

ILLUMINATION OPTICAL ASSEMBLY FOR PROJECTION LITHOGRAPHY

CROSS-REFERENCE TO RELATED APPLICATIONS

The present application is a continuation of, and claims benefit under 35 USC 120 to, international application PCT/EP2015/069215, filed Aug. 21, 2015, which claims benefit under 35 USC 119 of German Application No. 10 2014 217 612.3, filed Sep. 3, 2014. The entire disclosure of international application PCT/EP2015/069215 and German Application No. 10 2014 217 612.3 are incorporated by reference herein.

FIELD

The disclosure relates to an illumination optical assembly for projection lithography. Furthermore, the disclosure relates to a method for determining pupil regions which are illuminated with predefined illumination intensity within such an illumination optical assembly, an optical system including such an illumination optical assembly, an illumination system including such an illumination optical assembly, a projection exposure apparatus including such an optical system, a method for producing a micro- or nano-structured component, and a component produced by the method.

BACKGROUND

An illumination optical assembly including a transfer optical assembly and at least one illumination predefinition facet mirror disposed downstream is known from WO 2010/099807 A1 and US 2006/0132747 A1. Illumination optical assemblies in which the illumination predefinition facet mirror or a corresponding refractive component is arranged in a pupil plane are known from WO 2005/015314 A2, U.S. Pat. No. 5,963,305 and U.S. Pat. No. 7,095,560.

SUMMARY

The present disclosure seeks to develop an illumination optical assembly of the type mentioned in the introduction in such a way that an excessively high illumination intensity on the facets of the pupil illumination unit is avoided.

In one aspect, the disclosure provides an illumination optical assembly for projection lithography for illuminating an illumination field, in which an object field of a downstream imaging optical assembly is arrangeable, with illumination light of an EUV light source. The illumination optical assembly includes a pupil illumination unit, on which the illumination light impinges and which has facets for guiding illumination channels—which are at least partly superimposed in the illumination field—for illuminating a pupil in the illumination beam path with the illumination light with a predefined pupil intensity distribution. The pupil illumination unit is embodied such that a plurality of illumination channels of the pupil illumination unit illuminate only a part of the entire object field. The facets of the pupil illumination unit are arranged in such a way that individual illumination channels of the pupil illumination unit only partly illuminate the object field along an object displacement direction, in which an object is displaceable through the object field during the illumination. For at least some illumination channels it holds true that an extent of an illuminated partial field of the object field along the object displacement direction is smaller than a total extent of the object field along the object displacement direction. In the pupil an illumination intensity profile results which is dependent on an absolute value of a pupil coordinate corresponding to the object displacement direction. An illumination intensity of a first illuminated pupil region in the case of a first absolute value of the pupil coordinate differs from an illumination intensity of a second illuminated pupil region in the case of a second absolute value of the pupil coordinate by at least 20%.

In an aspect, the disclosure provides an illumination optical assembly for projection lithography for illuminating an illumination field, in which an object field of a downstream imaging optical assembly is arrangeable, with illumination light of an EUV light source. The illumination optical assembly includes a pupil illumination unit, on which the illumination light impinges and which has facets for guiding illumination channels—which are at least partly superimposed in the illumination field—for illuminating a pupil in the illumination beam path with the illumination light with a predefined pupil intensity distribution. The pupil illumination unit is embodied such that a plurality of illumination channels of the pupil illumination unit illuminate only a part of the entire object field.

It has been recognized that particularly if the facets of the pupil illumination unit are embodied as tiltable or as micromirrors, care is to be taken not to exceed a predefined maximum illumination intensity or a maximum thermal load on these facets since this otherwise results in adverse effects on a performance of the illumination optical assembly or a reduction of the stability of the facets and thus of the illumination optical assembly. It has furthermore been recognized that as a degree of freedom for reducing the illumination intensity on the facets it is possible to make use of the fact that not all of the facets have to contribute to the illumination of the entire object field. The illumination of partial fields of the object field is therefore used in a targeted manner for reducing the illumination intensity on the facets impinged on during this illumination. In order to reduce the illumination intensity on the facets, it is possible for example to make use of the fact that in the pupil a region illuminated is larger than is required for guiding the entire illumination light within a predefined pupil intensity distribution. Therefore, a degree of filling of the pupil is increased within predefined limits, which reduces the intensity loading on the individual facets of the pupil illumination unit. The pupil illumination unit can be designed such that all the facets of the pupil illumination unit only illuminate partial fields of the object field. The pupil of the illumination optical assembly is arranged such that it coincides with the pupil of a downstream imaging optical assembly or projection optical assembly or is conjugate with respect to this pupil plane of the imaging optical assembly. In this case, pupil is understood to mean that region in the imaging beam path of the imaging optical assembly in which individual rays emerging from the object field points intersect which, relative to the principal rays emerging from the object field points, are assigned in each case to the same illumination angle. Further explanations concerning the term "pupil" are found in US 2012/0069314 A1. Each illumination channel guides an illumination light partial beam with which an object field point is illuminated from a specific illumination direction. The splitting of the illumination light into a plurality of illumination channels by the pupil illumination unit serves for defining the illumination parameters "illumination intensity" and "illumination angle distribution" within predefined tolerance limits and at the same time for intermixing the illumination light in the object field. The partial fields which are illuminated via the facets of the pupil illumination unit on the object field can overlap one another. This is not mandatory, however. More than 100, more than 500 or even more than 1000 illumination channels of this type can be present. Within an illumination channel, the illumination light can in turn be guided via a plurality of micromirrors which can be tilted independently of one another. In each case exactly one illumination channel can be defined via a group of such micromirrors.

Each illumination channel includes, depending on the desired illumination direction distribution in the object field, a maximum partial zone or partial field of the object field which can be illuminated by the given illumination channel from directions that are within a desired illumination angle or illumination direction distribution. If the pupil illumination unit is situated in a pupil plane, then there are only two types of maximum partial fields in the case of object-field-independent pupils. Either an illumination channel overall enables a desired illumination direction. In that case the maximum partial field is of the same size as the object field. Alternatively the illumination direction of an illumination channel is not within the predefined illumination direction distribution. The illumination light does not impinge on such an illumination channel, such that this channel is dark over the entire object field and the channel is thus nonexistent for the illumination. If the pupil illumination unit is at a distance from the pupil plane, however, then for realizing the predefined illumination direction distribution this results in a great variation of individual maximum partial field sizes which can differ from one another by more than a factor of ten times. Here, too, the maximum partial field can at any rate be of the same size as the object field in the individual case.

In accordance with the first aspect, the facets of the pupil illumination unit are arranged in such a way that individual illumination channels of the pupil illumination unit only partly illuminate the object field along an object displacement direction, in which an object is displaceable through the object field during the illumination, wherein for at least some illumination channels it holds true that an extent of an illuminated partial field of the object field along the object displacement direction is smaller than a total extent of the object field along the object displacement direction, wherein in the pupil an illumination intensity profile results which is dependent on an absolute value of a pupil coordinate corresponding to the object displacement direction, wherein an illumination intensity of a first illuminated pupil region in the case of a first absolute value of the pupil coordinate differs from an illumination intensity of a second illuminated pupil region in the case of a second absolute value of the pupil coordinate by at least 20%. Such a pupil intensity distribution enables a design of the pupil illumination unit in which those facets of the pupil illumination unit which in principle experience a severe intensity loading generate only a reduced illumination intensity in the pupil, which reduces the intensity loading on the facets. A difference between the illumination intensities can also be greater than 20%, and can be for example 30%, 40%, 50%, 70%, 100% or even more. In this case, an origin of the pupil coordinate which corresponds to the object displacement direction is defined by a centre of the pupil of the illumination optical assembly. The subpupil regions respectively assigned to the illumination channels in the pupil of the illumination optical assembly can have, along the pupil coordinate which corresponds to the object displacement direction, an extent which is dependent on an absolute value of the pupil coordinate. In the case of different absolute values of the pupil coordinate, different illumination intensities are then present and subpupil regions of different lengths can also be present along this corresponding pupil coordinate. In the direction of the pupil coordinate perpendicular thereto, which therefore corresponds to a direction perpendicular to the object displacement direction, the illumination intensity within the pupil can be constant within a predefined tolerance range. The same correspondingly holds true for the abovementioned extent of the subpupil regions, which can likewise be constant along the further pupil coordinate within predefined tolerance limits. Such a pupil illumination intensity is not mandatory in the case of the illumination optical assembly of the second aspect.

The facets of the pupil illumination unit can be arranged in such a way that individual illumination channels of the pupil illumination unit only partly illuminate the object field along an object displacement direction, in which an object is displaceable through the object field during the illumination, wherein for all of the illumination channels it holds true that an extent of an illuminated partial field of the object field along the object displacement direction is smaller than a total extent of the object field along the object displacement direction, and wherein for a plurality of the illumination channels it holds true that an individual ratio between the extent of the illuminated partial field and the total extent of the object field along the object displacement direction deviates by less than 20% from a mean ratio—averaged for all of the illumination channels—between the extent of the illuminated partial field and the total extent of the object field along the object displacement direction. In the case of such an arrangement of the facets, a reduction of the thermal load is achieved by virtue of the fact that the partial fields illuminated via the illumination channels have a smaller extent along the object displacement direction than the respective maximum partial field. This shortening of the illuminated partial fields in the object displacement direction in comparison with the individual maximum partial field extent in the object displacement direction is carried out in the same way here for the plurality of illumination channels within a tolerance range. The deviation of the extent of the individual ratio of the illuminated partial field and the maximum extent in the object displacement direction from the mean ratio can be less than 15%, can be less than 10% and can even be less than 5%. This uniform shortening of the illuminated partial fields in the object displacement direction can hold true for all the illumination channels. Deviations from such a global shortening of the partial fields illuminated via the individual illumination channels can occur in individual cases, for example where a deviation is unavoidable for example on account of a subdivision of the facets assigned to the illumination channels into individual mirrors owing to a finite size of the individual mirrors on account of quantization effects or in cases in which for example for the purpose of a local pupil correction or intensity correction of the object field illumination by the illumination optical assembly in a targeted manner parts of the illumination channels do not contribute to the object field illumination, that is to say are partly switched off, or in a targeted manner additional parts of illumination channels are used for the object field illumination, that is to say are switched on.

Such a uniform shortening of the partial field illumination in the object displacement direction leads to a uniform pupil illumination. In this case, a reduction of an intensity loading of the facets of the pupil illumination unit can be achieved by enlargement of the pupil regions illuminated in the pupil, that is to say by enlargement of a degree of filling of the pupil. Technically, this can be achieved in particular by enlargement of the number of illumination channels used for the object field illumination.

Each of the illumination channels impinges on a subpupil region in the pupil of the illumination optical assembly. An extension of such subpupil regions along a pupil coordinate which corresponds to the object displacement direction can have the same extent for a plurality of the illumination channels or for all of the illumination channels. This corresponding pupil coordinate determines the illumination directions in an illumination light incidence plane perpendicular to the object plane, wherein the object displacement direction runs in the illumination light incidence plane.

The facets of the pupil illumination unit can be are arranged in such a way that individual illumination channels of the pupil illumination unit only partly illuminate the object field along an object displacement direction, in which an object is displaceable through the object field during the illumination, wherein for at least some illumination channels it holds true that an extent of an illuminated partial field of the object field along the object displacement direction is smaller than a total extent of the object field along the object displacement direction, wherein in the pupil an illumination intensity profile results which is dependent on an absolute value of a pupil coordinate corresponding to the object displacement direction, wherein an illumination intensity of a first illuminated pupil region in the case of a first absolute value of the pupil coordinate differs from an illumination intensity of a second illuminated pupil region in the case of a second absolute value of the pupil coordinate by at least 20%. Such a pupil intensity distribution allows a design of the pupil illumination unit in which those facets of the pupil illumination unit which in principle experience a severe intensity loading generate only a reduced illumination intensity in the pupil, which reduces the intensity loading on the facets. A difference between the illumination intensities can also be greater than 20%, and can be for example 30%, 40%, 50%, 70%, 100% or even more. In this case, an origin of the pupil coordinate which corresponds to the object displacement direction is defined by a centre of the pupil of the illumination optical assembly. The subpupil regions respectively assigned to the illumination channels in the pupil of the illumination optical assembly can have, along the pupil coordinate which corresponds to the object displacement direction, an extent which is dependent on an absolute value of the pupil coordinate. In the case of different absolute values of the pupil coordinate, different illumination intensities are then present and subpupil regions of different lengths can also be present along this corresponding pupil coordinate. In the direction of the pupil coordinate perpendicular thereto, which therefore corresponds to a direction perpendicular to the object displacement direction, the illumination intensity within the pupil can be constant within a predefined tolerance range. The same correspondingly holds true for the extent of the subpupil regions, which can likewise be constant along the further pupil coordinate within predefined tolerance limits.

The pupil illumination unit can include a first facet mirror including a multiplicity of individual mirrors, which are individually tiltable, and a further facet mirror including a plurality of individually tiltable facets arranged alongside one another and serving for the reflective, superimposing guidance of partial beams of a beam of the EUV illumination light to the object field, wherein the first facet mirror is arranged in or near a field plane that is conjugate with respect to the object field, wherein the further facet mirror is arranged at a distance from a pupil plane of the illumination optical assembly, wherein the facets of the first facet mirror for illuminating in each case a further facet of the further facet mirror are groupable to form virtual facets groups. Such an illumination optical is also known as a specular reflector. The pupil illumination unit can include a first facet mirror including a multiplicity of individual mirrors, which are individually tiltable, and a pupil facet mirror including a plurality of pupil facets arranged alongside one another and serving for the reflective, superimposing guidance of partial beams of a beam of the EUV illumination light to the object field, wherein the pupil facet mirror is arranged in a pupil plane of the illumination optical assembly, such that a position of the respective pupil facet on the pupil facet mirror predefines an illumination direction for the field points of the object field, wherein the facets of the first facet mirror for illuminating in each case a pupil facet are groupable to form virtual first facet groups. Such an illumination optical assembly is also known as a fly's eye condenser. The assemblies described in the preceding sentences of this paragraph have proven to be particularly suitable for the defined illumination of the object field. The first facet mirror can be arranged in a field plane of the illumination optical assembly, which is imaged into an object plane, in which the object field is arranged. In some embodiments, the further facet mirror is at a distance from a pupil plane of the illumination optical assembly or the downstream projection optical assembly. Each of the abovementioned illumination channels is guided exactly by precisely one of the further facets of the further facet mirror or exactly by precisely one of the pupil facets. The facets of the first facet mirror and/or the facets of the further facet mirror can in turn be subdivided into a plurality of individual mirrors. These individual mirrors can be individually tiltable. Such facets subdivided into individual mirrors are also designated as facet groups or as virtual facets.

The virtual facet groups can be designed for illuminating partial fields, wherein the extension of at least some of the partial fields in an object displacement direction of an object to be illuminated via the illumination optical assembly is smaller than the extension of the entire object field in the object displacement direction. Such a reduction of a partial field extent in the object displacement direction is adapted well to an in particular scanning mode of operation of a projection exposure apparatus equipped with the illumination optical assembly. Moreover, all partial fields which illuminate the virtual facet groups can have a smaller extension in the object displacement direction than the extension of the entire object field in the object displacement direction.

The virtual facet groups can be designed for illuminating partial fields whose extension in an object displacement direction of an object to be illuminated via the illumination optical assembly differs by more than 20%. Such differences in the extent of the partial fields in the object displacement direction yield a degree of freedom in the predefinition of the illumination intensity on the facets of the pupil illumination unit. The extension of the partial fields in the object displacement direction can differ by more than 30%, by more than 40%, by more than 50%, by more than 70%, by more than 100% or even by a still greater amount.

Virtual facet groups which illuminate regions of the illumination pupil which are situated perpendicularly to the object displacement direction at the same coordinate in the pupil can be designed for illuminating partial fields having the same extension in the object displacement direction. Such an assignment of the virtual facet groups provides for evening out the illumination parameters perpendicular to the object displacement direction. In a scan-integrated manner, that is to say in a manner integrated in the object displacement direction, it is then ensured that all object field points have the same illumination conditions.

An arrangement and design of the pupil illumination unit in such a way that different pupil intensity distributions over the pupil can result for different field points of the object field. Such an arrangement and design of the illumination optical assembly allows a predefinition of the pupil intensity distribution changing over the object field in such a way that during displacement or scanning of an object through the object field a homogenization of the intensity of the illumination of a displacement- or scan-integrated pupil ensues which results for a respective object point. In a displacement- or scan-integrated manner, it is then possible to attain a situation in which each object point within predefined tolerances "sees" the same pupil intensity distribution, that is to say is impinged on by light of predefined intensity from the same illumination angle distribution. A homogeneous illumination with regard to intensity and illumination angle distribution is thus ensured in a displacement- or scan-integrated manner. A pupil intensity distribution in the form of a plurality of pupil rods can result for an object field point in a displacement- or scan-integrated manner, wherein each of the pupil rods is brought about by an illumination channel of the illumination light. In a pupil dimension assigned to the displacement or scan direction, such a pupil rod can have a larger extension than in the pupil dimension perpendicular thereto. An extension of the pupil rods in the pupil dimension assigned to the displacement or scan direction can be influenced by the choice of a distance between an illumination predefinition facet mirror of the pupil illumination unit and a pupil plane.

The above-discussed aspects of the illumination optical assembly and the features associated therewith can be combined with one another in any desired way. In this regard, it is possible, for example, to combine the illumination optical assembly in accordance with the first aspect with the features which have been explained above in association with the illumination optical assembly in accordance with the second aspect.

A method for determining pupil regions which are illuminated with different illumination intensities within an illumination optical assembly described above can include: predefining an illumination angle distribution desired for illuminating the object field, that is to say a raw intensity distribution of the illumination light over the pupil; identifying pupil regions to be illuminated which form the raw intensity distribution; ascertaining an actual illumination intensity of the facets of the pupil illumination unit for illuminating the identified pupil regions; comparing the actual illumination intensity with a predefined maximum setpoint illumination intensity; reducing the actual illumination intensity on the facets where it is greater than the setpoint illumination intensity. Such a method for determining pupil regions uses the above-explained degrees of freedom for reducing the actual illumination intensity on the facets. For reducing the actual illumination intensity on the facets, in this method, the pupil regions to be illuminated can be adapted in terms of their shape and size within the pupil, that is to say can be changed in terms of their shape and/or size within predefined limits.

In order to reduce the actual illumination intensity, firstly it is possible to determine extents of the pupil regions to be illuminated in a dimension perpendicular to an object displacement direction of an object during an object illumination time period. Depending on this extent, then a dimension of the virtual facet groups in the object displacement direction is predefined, that is to say, if appropriate, a scan length reduction is carried out. As a result, a pupil intensity dependent on the object displacement direction can be brought about, which averages out in a scan-integrated manner.

In a method, the actual illumination intensity on the further facets of the further facet mirror can be reduced by selection of first facets of the first facet mirror which are assigned to these further facets via illumination channels, wherein the selected first facets guide an actual illumination intensity of the illumination light which leads to an actual illumination intensity on the second facets which corresponds at most to the setpoint illumination intensity. For reducing the actual illumination intensity, according to such a method, it is furthermore possible to redistribute the illumination intensity within the pupil regions to be illuminated such that the actual illumination intensity on the facets is reduced where it is greater than the setpoint illumination intensity. Thermal load spikes on the further, second facets which result on account of an in particular far-field-governed, uneven actual illumination intensity on the first facets can be smoothed as a result. A maximum thermal load on the further facets is effectively reduced as a result.

In a method, the actual illumination intensity on the further facets of the further facet mirror can be reduced by partial illumination of the object field along the object displacement direction, wherein a ratio of the extent of the illuminated partial field of the object field along the object displacement direction to the total extent of the object field along the object displacement direction is chosen such that said ratio compensates for an overshooting of the setpoint illumination intensity by an actual illumination intensity on the further facet, such that after the reduction of the extent of the illuminated partial field the actual illumination intensity on the further facets results which corresponds at most to the setpoint illumination intensity. Such a method combines the possibilities for thermal load reduction which is brought about firstly by a targeted reduction of the extent of the illuminated partial fields along the object displacement direction, that is to say by reduction of a scan length, and secondly by a redistribution of the illumination intensity within the pupil regions to be illuminated. The product of individual scan length reduction and selected actual illumination intensity can be predefined to be at least approximately constant for a plurality of the second facets and can deviate from a setpoint product value only by a predefined tolerance value. Far-field-governed thermal load spikes, in particular on the second facet mirror, can be smoothed as a result. A more homogeneous light distribution can result in the pupil plane of the illumination optical assembly.

The advantages of an optical system including an illumination optical assembly described herein, of an illumination system including an illumination optical assembly described herein, of a projection exposure apparatus including such an optical system, of a production method using such a projection exposure apparatus, and of a micro- or nanostructured component made by such a method corresponds to those which have already been discussed above with reference to the illumination optical assembly.

In some embodiments, illumination light intensities which differ by more than 20% can impinge on the first facet mirror. Such embodiments can use as a further degree of freedom the circumstance that the first facet mirror is illuminated regularly with an inhomogeneous far field from the light source. This is used for reducing an illumination intensity on the most highly loaded facets of the pupil illumination unit. In this case, those virtual facet groups which illuminate regions of the illumination pupil which are situated perpendicularly to the object displacement direction at the same coordinate in the pupil can be impinged on by an illumination intensity which deviates from a mean illumination intensity of impingement on the virtual facet groups by less than 10%. Even if the inhomogeneity of the far field on the facets of the first facet mirror is used for reducing the intensity loading on the facets of the pupil illumination unit, it can thus be ensured that identical illumination conditions are maintained perpendicularly to the object displacement direction. The use of the intensity differences in the impingement on the first facet mirror can be used for thermal load reduction on the facets of the further facet mirror such that via the illumination predefinition facets of the further facet mirror the object field is completely illuminated along the object displacement direction. The extent of partial fields illuminated via the assigned illumination channels along the object displacement direction can be equal to the total extent of the object field in the object displacement direction. By using the inhomogeneities of the intensity impingement on the first facet mirror, it is thus also possible to achieve an illumination for which a degree of filling of the pupil is not enlarged in comparison with a minimum achievable degree of filling of the pupil, since all illumination channels illuminate their individual maximum partial field.

The above-discussed method for determining pupil regions can also be carried out in the illumination system taking account of an intensity distribution of the illumination of the first facet mirror.

BRIEF DESCRIPTION OF THE FIGURES

Exemplary embodiments of the disclosure are explained in greater detail below with reference to the drawing, in which:

FIG. 6 shows schematically a plan view of a scan-integrated raw pupil intensity distribution in the case of a y-dipole illumination setting with use of the illumination optical assembly according to FIGS. 1 and 2 with an illumination predefinition facet mirror arranged at a distance from a pupil plane of the illumination optical assembly, wherein an object field on the reticle is in each case completely illuminated in the scan direction via the illumination predefinition facets;

FIG. 7 schematically shows an excerpt from the object field which is illuminated via an illumination predefinition facet in the case of the illumination setting according to FIG. 6;

FIG. 8 shows, in an illustration similar to FIG. 6, one of the poles of a y-dipole illumination setting, wherein only a section of the entire object field is illuminated in the scan direction via each of the illumination predefinition facets;

FIG. 9 shows, in an illustration similar to FIG. 7, a partial object field that is in turn illuminated via one of the illumination predefinition facets in the case of the illumination setting according to FIG. 8;

DETAILED DESCRIPTION

Figure 1:
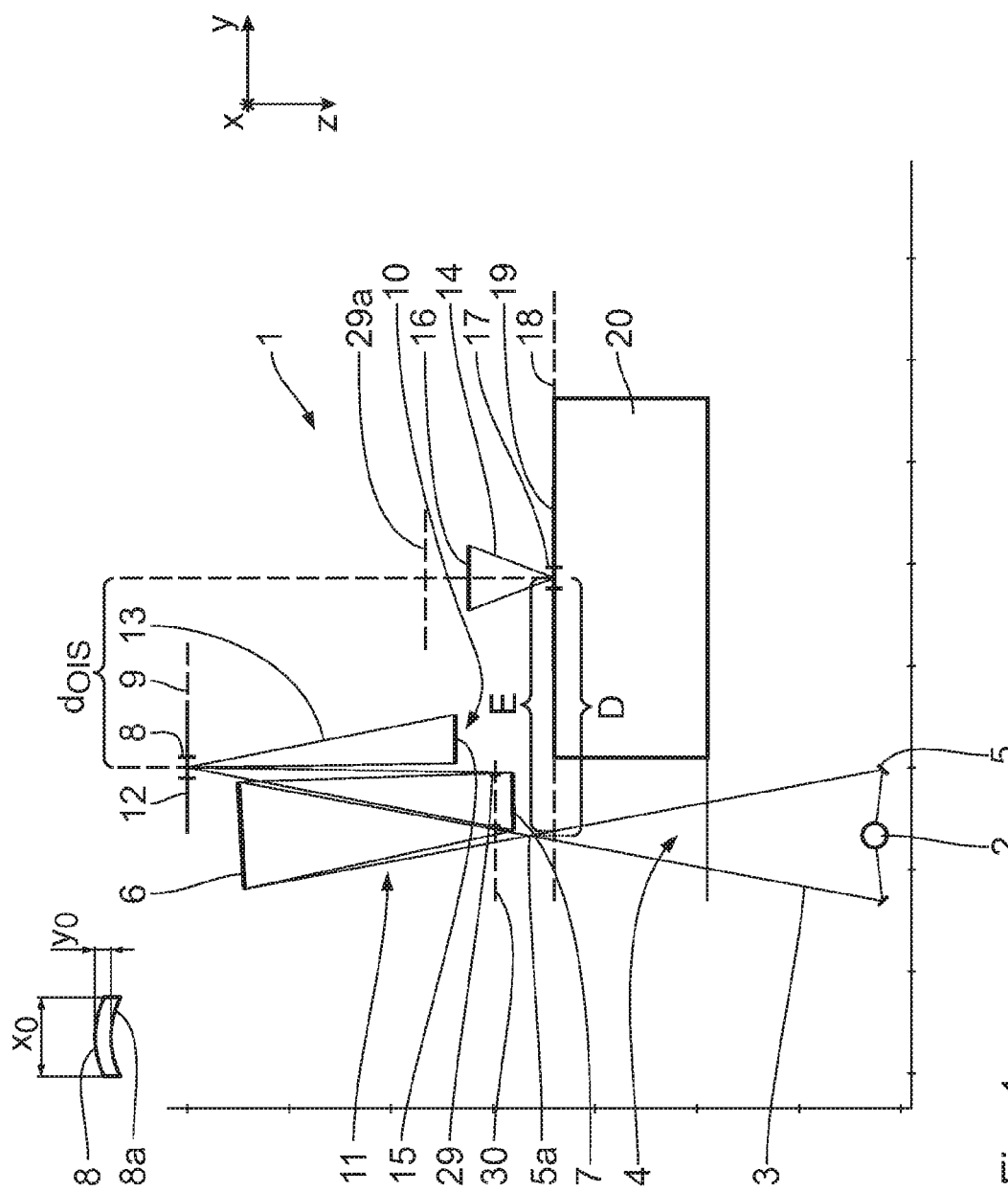
FIG. 1 shows highly schematically in meridional section a projection exposure apparatus for EUV microlithography including a light source, an illumination optical assembly and a projection optical assembly.

A projection exposure apparatus 1 for microlithography that is illustrated highly schematically and in meridional section in FIG. 1 has a light source 2 for illumination light 3. The light source is an EUV light source that generates light in a wavelength range of between 5 mm and 30 mm. This can be an LPP (Laser Produced Plasma) light source, a DPP (Discharge Produced Plasma) light source or a synchrotron-radiation-based light source, for example a Freie electron laser (FEL).

For guiding the illumination light 3, proceeding from the light source 2, use is made of a transfer optical assembly 4. The latter has a collector 5, which is illustrated only with regard to its reflective effect in FIG. 1, and a transfer facet mirror 6, which is described in even greater detail below and which is also designated as first facet mirror or as field facet mirror. An intermediate focus 5a of the illumination light 3 is arranged between the collector 5 and the transfer facet mirror 6. A numerical aperture of the illumination light 3 in the region of the intermediate focus 5a is NA=0.182, for example. An illumination predefinition facet mirror 7, which is likewise explained in even greater detail below, is disposed downstream of the transfer facet mirror 6 and thus the transfer optical assembly 4. The optical components 5 to 7 are parts of an illumination optical assembly 11 of the projection exposure apparatus 1.

The transfer facet mirror 6 is arranged in a field plane of the illumination optical assembly 11.

In one embodiment of the illumination optical assembly 11, the illumination predefinition facet mirror 7 can, which is likewise explained in even greater detail below, be arranged in or in the region of a pupil plane of the illumination optical assembly 11 and is then also designated as pupil facet mirror. In a further embodiment, the illumination predefinition facet mirror 7 of the illumination optical assembly 11 can also be arranged at a distance from the pupil plane or the pupil planes of the illumination optical assembly 11. Such an embodiment is also designated as specular reflector.

A reticle 12 is disposed downstream of the illumination predefinition facet mirror 7 in the beam path of the illumination light 3, the reticle being arranged in an object plane 9 of a downstream projection optical assembly 10 of the projection exposure apparatus 1. The projection optical assembly 10 and the projection optical assemblies of the further embodiments described below are in each case a projection lens. The illumination optical assembly 11 is used to illuminate an object field 8 on the reticle 12 in the object plane 9 in a defined manner. The object field 8 simultaneously constitutes an illumination field of the illumination optical assembly 11. Generally it holds true that the illumination field is formed in such a way that the object field 8 can be arranged in the illumination field.

The illumination predefinition facet mirror 7, like the transfer facet mirror 6 as well, is part of a pupil illumination unit of the illumination optical assembly and serves for illuminating an entrance pupil of the projection optical assembly 10 with the illumination light 3 with a predefined pupil intensity distribution. The entrance pupil of the projection optical assembly 10 can be arranged in the illumination beam path upstream of the object field 8 or else downstream of the object field 8.

In the case of the embodiment of the illumination optical assembly 11 including an illumination predefinition facet mirror 7 arranged in a pupil plane, the pupil plane can be imaged into the entrance pupil of the projection optical assembly 10 via a downstream transfer optical assembly. Alternatively, the illumination predefinition facet mirror 7 can also be arranged in the pupil plane of the entrance pupil of the projection optical assembly 10. In the case of the embodiment as a specular reflector, such a transfer optical assembly is not necessary and it is unimportant, in principle, whether the entrance pupil of the projection optical assembly 10 is arranged in the illumination beam path upstream of the object field 8 or downstream of the object field 8.

In order to facilitate the presentation of positional relationships, a Cartesian xyz-coordinate system is used hereinafter. The x-direction runs perpendicularly to the plane of the drawing into the latter in FIG. 1. The y-direction runs towards the right in FIG. 1. The z-direction runs downwards in FIG. 1. Coordinate systems used in the drawing have x-axes running parallel to one another in each case. The course of a z-axis of the coordinate systems follows a respective principal direction of the illumination light 3 within the figure respectively under consideration.

The object field 8 has an arcuate or partly circular shape and is delimited by two mutually parallel circle arcs and two straight side edges which run in the y-direction with a length $y_0$ and are at a distance $x_0$ from one another in the x-direction. The aspect ratio $x_0/y_0$ is 13 to 1. An insert in FIG. 1 shows a plan view of the object field 8, this plan view not being true to scale. A boundary shape 8a is arcuate. In an alternative and likewise possible object field 8, the boundary shape thereof is rectangular, likewise with aspect ratio $x_0/y_0$.

The projection optical assembly 10 is indicated only in part and highly schematically in FIG. 1. An object field side numerical aperture 13 and an image field side numerical aperture 14 of the projection optical assembly 10 are illustrated. Between indicated optical components 15, 16 of the projection optical assembly 10, which components can be embodied for example as mirrors that are reflective for the EUV illumination light 3, there are situated further optical components—not illustrated in FIG. 1—of the projection optical assembly 10 for guiding the illumination light 3 between these optical components 15, 16.

The projection optical assembly 10 images the object field 8 into an image field 17 in an image plane 18 on a wafer 19, which, like the reticle 12 as well, is carried by a holder (not illustrated in more specific detail). Both the reticle holder and the wafer holder are displaceable both in the x-direction and in the y-direction via corresponding displacement drives. A structural space requirement of the wafer holder is illustrated as a rectangular box at 20 in FIG. 1. The structural space requirement 20 is rectangular with an extent in x-, y- and z-directions that is dependent on the components to be accommodated herein. The structural space requirement 20 has, for example, proceeding from the centre of the image field 17, an extension of 1 m in the x-direction and in the y-direction. In the z-direction, too, the structural space requirement 20, proceeding from the image plane 18, has an extension of 1 m, for example. The illumination light 3 has to be guided in the illumination optical assembly 11 and the projection optical assembly 10 in such a way that it is in each case guided past the structural space requirement 20.

The transfer facet mirror 6 has a multiplicity of transfer facets 21. The transfer facet mirror 6 can be embodied as an MEMS mirror. The transfer facets 21 are micromirrors switchable at least between two tilting positions. The transfer facets 21 can be embodied as micromirrors tiltable in a driven manner about two rotation axes perpendicular to one another.

Figure 2:
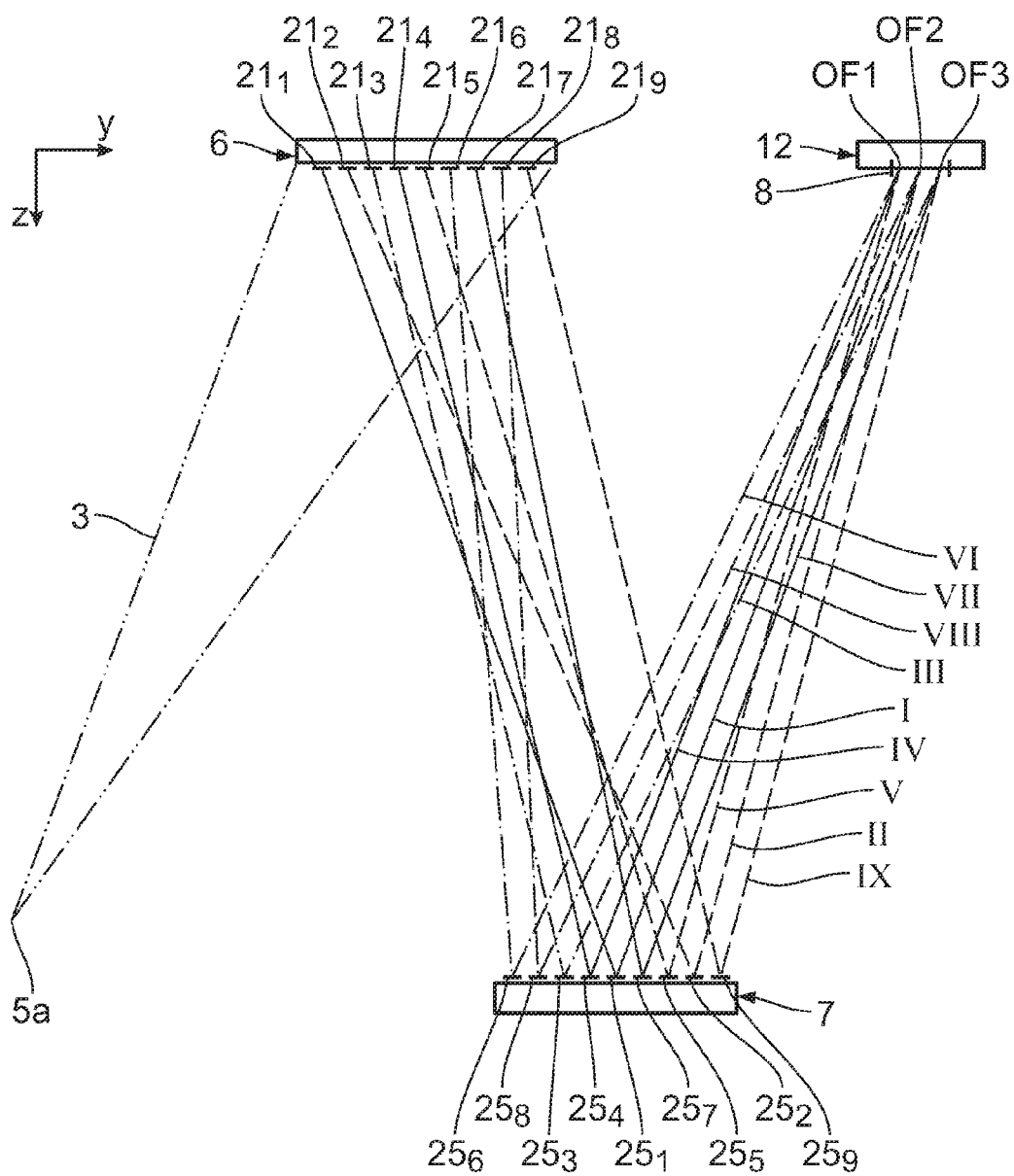
FIG. 2 shows schematically and likewise in meridional section a beam path of selected individual rays of illumination light within a pupil illumination unit of the illumination optical assembly according to FIG. 1, proceeding from an intermediate focus through to a reticle arranged in the object plane of the projection optical assembly.

From the transfer facets 21, a line having a total of nine transfer facets 21 is illustrated schematically in the yz-sectional view according to FIG. 2, the transfer facets being indexed from left to right by $21_1$ to $21_9$ in FIG. 2. In actual fact, the transfer facet mirror 6 has a significantly greater multiplicity of the transfer facets 21. The transfer facets 21 are grouped into a plurality of transfer facet groups not illustrated in more specific detail in FIG. 2 (in this respect, cf. in particular FIGS. 4 and 5). These transfer facet groups are also designated as virtual field facets or as virtual facet groups.

In the case of an embodiment of the illumination optical assembly including an illumination predefinition facet mirror 7 arranged in a pupil plane, an x/y aspect ratio of the transfer facet groups is at least of the same magnitude as the x/y aspect ratio of the object field 8. In the case of the embodiment illustrated, the x/y aspect ratio of at least some or else all of the transfer facet groups is greater than the x/y aspect ratio of the object field 8. The transfer facet groups have a partly circular curved or rectangular group boundary shape that is similar to the boundary shape of the object field 8. For further details regarding the construction of the transfer facet mirror 6, reference is made to WO 2010/099 807 A.

The transfer facet groups into which the transfer facets 21 are grouped, or the monolithic facets corresponding to these facet groups, can have an extent of 70 mm in the x-direction and of approximately 4 mm in the y-direction.

Each of the transfer facet groups is arranged from 100 columns—arranged in a manner offset with respect to one another in the x-direction—each having seven lines of transfer facets 21 arranged alongside one another in the y-direction. Each of the transfer facets 21 is rectangular.

Each of the transfer facet groups guides a portion of the illumination light 3 via an illumination channel for partial or complete illumination of the object field 8.

For further details of the embodiment of the illumination predefinition facet mirror 7 and the projection optical assembly 10, reference is made to WO 2010/099 807 A.

If the illumination predefinition facet mirror 7 is situated in a pupil plane, then each illumination predefinition facet 25 can either illuminate the entire object field, provided that the pupil shape is intended to be field-independent, or it remains totally unused for a predefined pupil shape, also designated as illumination setting. If it contributes to the illumination of the object field 8, then always with at least almost identical pupil coordinate. Since the illumination predefinition facets 25 situated in a pupil plane in principle can, but need not necessarily, illuminate the entire object field, it is possible to illuminate them with virtual field facets which all have almost the same shape. In particular, it is then also conceivable to equip the transfer facet mirror 6 with monolithic transfer facets 21 of fixed shape, wherein each transfer facet 21 is then assigned to exactly one illumination channel with a fixed illumination direction.

If the illumination predefinition facet mirror 7 is not arranged in a pupil plane of the illumination optical assembly 11, then at least some of the illumination predefinition facets 25 can illuminate only a partial zone of the object field 8. The partial zones are very individually shaped and, moreover, are dependent on the desired illumination direction distribution (pupil shape) in the object field 8. The illumination predefinition facets 25 are therefore illuminated by very differently shaped virtual field facets, the shape of which corresponds precisely to the shape of the respective partial field to be illuminated. Moreover, each illumination predefinition facet 25 contributes to different regions of the pupil depending on the location in the object field 8.

The illumination predefinition facet mirror 7 can be embodied as an MEMS mirror. The illumination predefinition facets 25 are micromirrors switchable between at least two tilting positions. Particularly if the illumination predefinition facet mirror 7 is arranged at a distance from a pupil plane of the illumination optical assembly, the illumination predefinition facets 25 can be embodied as micromirrors which are tiltable in a driven manner about two mutually perpendicular tilting axes continuously and independently, that is to say can be positioned into a multiplicity of different tilting positions.

One example of the predefined assignment of the transfer facets 21 to the illumination predefinition facets 25 is illustrated in FIG. 2. The illumination predefinition facets 25 respectively assigned to the transfer facets $21_1$ to $21_9$ are indexed according to this assignment. The illumination predefinition facets 25 are illuminated from left to right on the basis of this assignment in the order $25_6$, $25_8$, $25_3$, $25_4$, $25_1$, $25_7$, $25_5$, $25_2$ and $25_9$.

The indices 6, 8 and 3 of the facets 21, 25 include three illumination channels VI, VIII and III, which illuminate three object field points OF1, OF2, OF3, which are numbered from left to right in FIG. 2, from a first illumination direction. The indices 4, 1 and 7 of the facets 21, 25 belong to three further illumination channels IV, I, VII, which illuminate the three object field points OF1 to OF3 from a second illumination direction. The indices 5, 2 and 9 of the facets 21, 25 belong to three further illumination channels V, II, IX, which illuminate the three object field points OF1 to OF3 from a third illumination direction.

The illumination directions assigned to
the illumination channels VI, VIII, III, the illumination channels IV, I, VII and
the illumination channels V, II, IX
are identical in each case. The assignment of the transfer facets 21 to the illumination predefinition facets 25 is therefore such that a telecentric illumination of the object field 8 results in the case of the illumination example illustrated pictorially.

The illumination of the object field 8 via the transfer facet mirror 6 and the illumination predefinition facet mirror 7 can be carried out in the manner of a specular reflector. The principle of the specular reflector is known from US 2006/0132747 A1.

The projection optical assembly 10 has an object-image offset do's of 930 mm. The offset is defined as the distance between a midpoint of the object field 8 and an intersection point of a normal to the midpoint of the image field 17 through the object plane 9. The projection exposure apparatus 1 including the projection optical assembly 10 has an intermediate focus-image offset D of 1280 mm. The intermediate focus-image offset D is defined as the distance between the midpoint of the image field 17 and an intersection point of a normal from the intermediate focus 5a to the image plane 18. The projection exposure apparatus 1 including the projection optical assembly 10 has an illumination light beam-image offset E of 1250 mm. The illumination light beam-image offset E is defined as the distance between the midpoint of the image field 17 and an intersection region of the illumination light beam 3 through the image plane 18.

Figure 3:
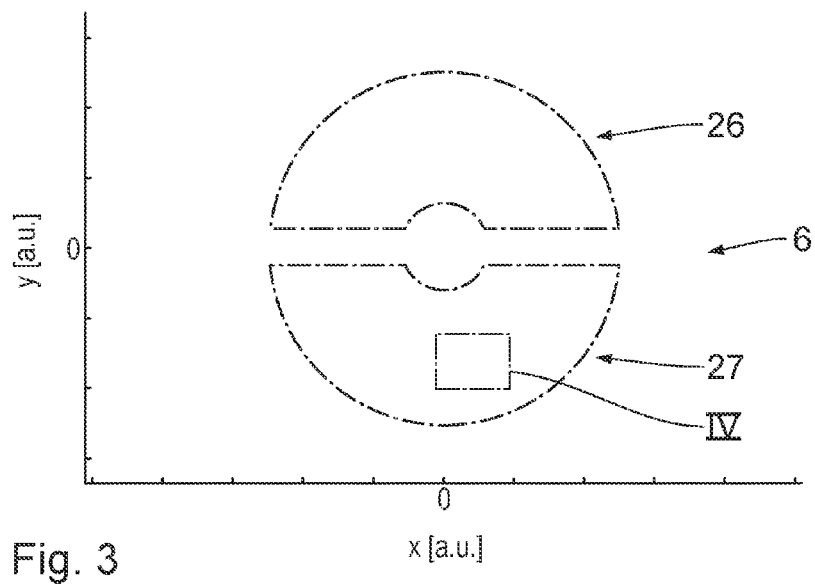
FIG. 3 shows a plan view of a transfer facet mirror of the illumination optical assembly, the mirror being arranged in a field plane.

FIG. 3 shows a plan view of the transfer facet mirror 6. The number of transfer facets 21 on the transfer facet mirror 6 is so great that individual transfer facets 21 are not discernible in FIG. 3. The transfer facets 21 are arranged in two approximately semicircular facet regions 26, 27 that are illuminated with a far field of the illumination light 3.

Figure 4:
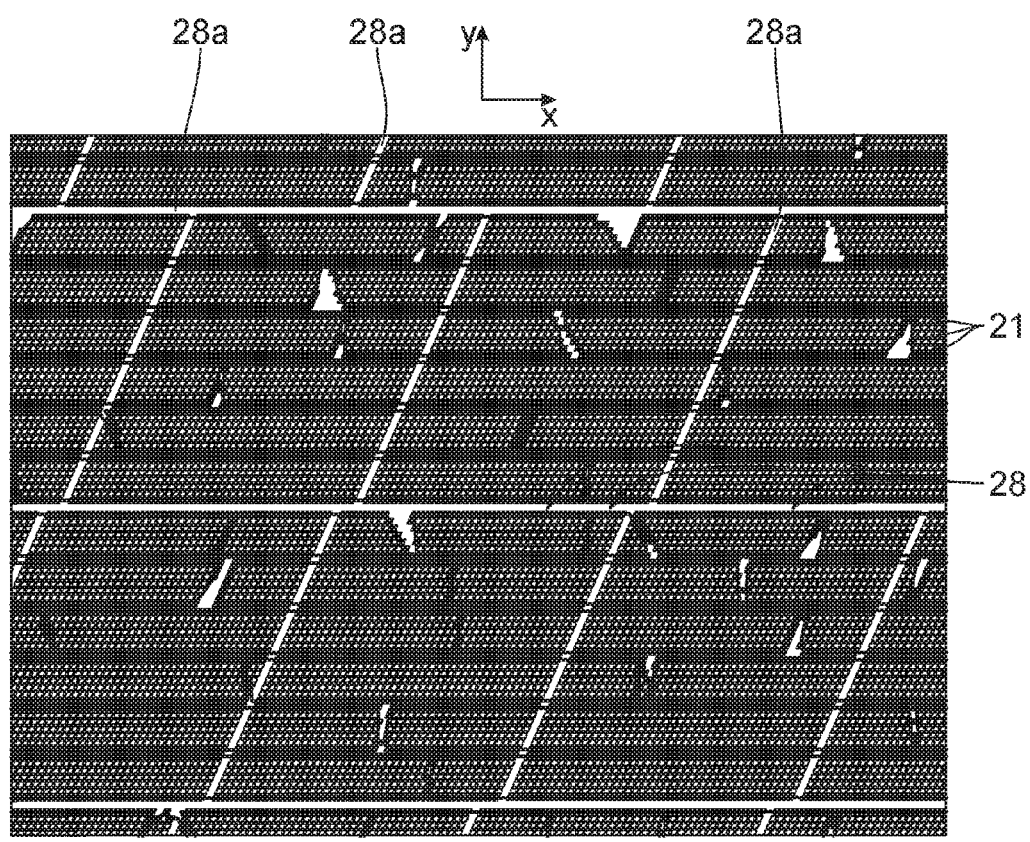
FIG. 4 shows an enlarged excerpt of detail IV from FIG. 3 which illustrates a subdivision of illuminated sections on the transfer facet mirror which constitute virtual facet groups to which illumination predefinition facets of a illumination predefinition facet mirror disposed downstream in the illumination optical assembly are assigned via illumination channels, wherein an x-dipole illumination setting is set via the two facet mirrors.

FIG. 4 shows, in an excerpt from FIG. 3, a subdivision of the transfer facets 21 into the transfer facet groups 28. The transfer facet groups 28 are in each case imaged into the object field 8 via the illumination predefinition facet mirror 7. All transfer facets 21 of a respective one of the transfer facet groups 28 illuminate one and the same illumination predefinition facet 25.

The occupation of the transfer facet mirror 6 with transfer facet groups 28 according to FIG. 4 is designed for an illumination pupil of the illumination optical assembly 11 with an x-dipole illumination setting. In a pupil plane of the illumination optical assembly 11, in the case of such an illumination setting, two illuminated pupil regions spaced apart from one another in a pupil coordinate $\sigma_x$ corresponding to the x-direction are present, which is explained in even greater detail below.

In FIG. 4, the transfer facets 21 have the shape of parallelograms sheared perpendicular to the scan direction. The transfer facets 21 are seated on facet carrier components (not illustrated in more specific detail) that are likewise parallelogram-shaped. The edges of the facet carrier components can be discerned as wide white bars 28a without transfer facets 21 in horizontal and oblique orientation in FIG. 4. The transfer facet groups 28 are identified by boundary lines having the course of polygon progressions. The transfer facet groups 28 usually extend across facet carrier component groups. For the present x-dipole illumination setting, the transfer facet groups 28 are predominantly almost rectangular or trapezium-shaped and have only very small gaps between adjacent transfer facet groups 28. The gaps between the individual transfer facet groups 28 are illustrated in more than proportional size in FIG. 4. The area proportion of the gaps in relation to the area of the entire facet carrier components is less than 10%.

The transfer facet groups 28 serve for illuminating a rectangular object field 8. The illumination predefinition facets 25 serve for the reflective, superimposing guidance of partial beams of the illumination light 3 towards the object field 8. A position of the respective illumination predefinition facet 25 on the illumination predefinition facet mirror 7 predefines an illumination direction for the field points of the object field 8. An x-extension of the transfer facet groups 28 is such that the image of the respective transfer facet group 28 maximally covers the entire object field 8 in the x-direction. The same correspondingly holds true for the y-extension of the transfer facet groups 28. As can be gathered from the enlarged excerpt according to FIG. 4, there are many transfer facet groups 28 whose x-extension is smaller than a maximum possible x-extension, such that an image of the transfer facet groups 28 in the object field 8 in the x-dimension illuminates only a part of the object field 8.

Depending on the illumination setting to be predefined via the illumination optical assembly 11, there exists for each transfer facet group 28, that is to say for each illumination channel, a maximum partial zone or partial field of the object field 8 which can be illuminated by the given illumination channel from directions that are contained in the illumination setting to be predefined. This maximum partial field size can attain the size of the entire object field 8, but in particular in the x-direction can also be smaller than the x-extension of the object field 8.

It is assumed hereinafter that at any rate along the object displacement direction y the extension of the maximum partial field corresponds to the y-extension of the object field 8.

Figure 5:
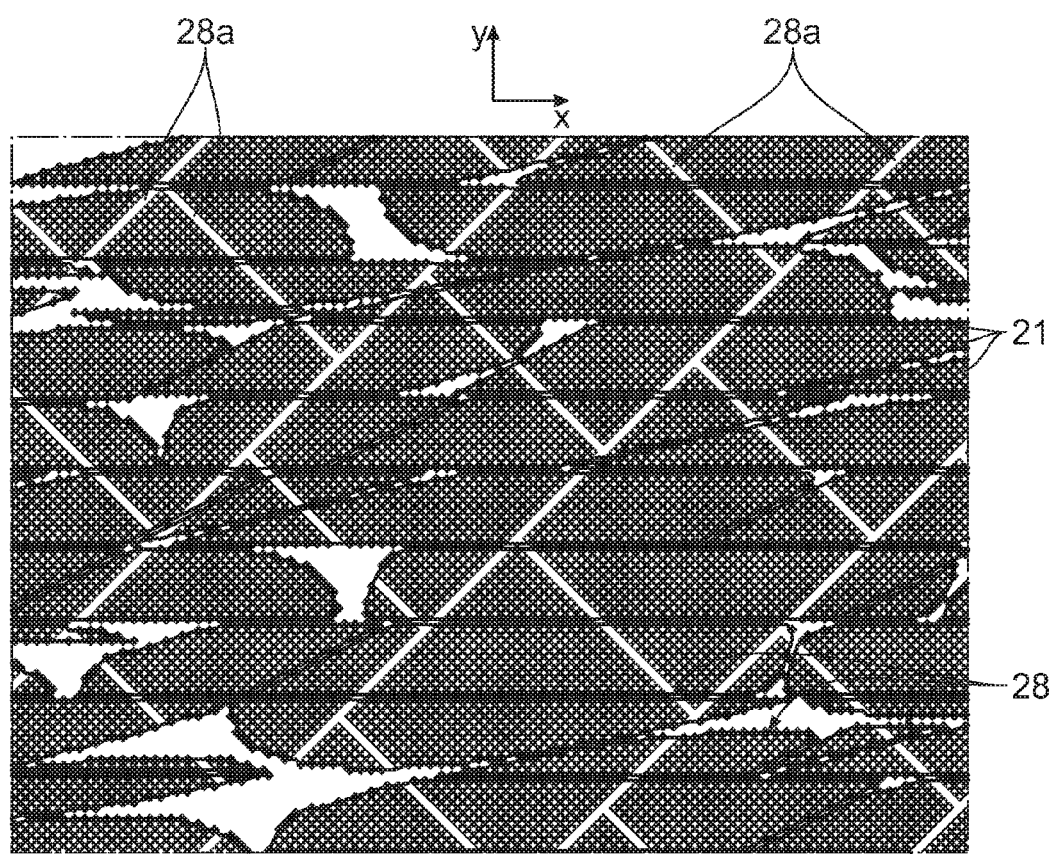
FIG. 5 shows, in an illustration similar to FIG. 4, a subdivision of illuminated sections on the transfer facet mirror which in turn constitute virtual facet groups which are assigned to the illumination predefinition facets of the downstream illumination predefinition facet mirror in the case of a y-dipole illumination setting via illumination channels.

FIG. 5 shows an excerpt from a corresponding subdivision of the transfer facet mirror 6 into transfer facet groups 28 for a y-dipole illumination setting, for which some examples are explained in even greater detail below with reference to the further figures. In comparison with the subdivision of the transfer facet groups 28 according to FIG. 4, significantly more transfer facet groups 28 whose images in the object field 8 fill the entire x-extension thereof are present in the case of the subdivision according to FIG. 5.

FIG. 5 shows transfer facets 21 of square shape, the edges of which are rotated by 45° relative to the scan direction. The same holds true for the likewise square facet carrier assemblies, the edges of which are once again visible by virtue of thick, white bars 28, then running obliquely.

In the case of the occupation of the transfer facet mirror 6 with transfer facet groups 28 according to FIG. 4, less than 7% of all the transfer facets 21 of the transfer facet mirror 6 are not used, that is to say do not contribute to the illumination of the downstream illumination predefinition facet mirror 7. This correspondingly also holds true for the occupation according to FIG. 5.

In the case of the occupation according to FIG. 5, the number of transfer facet groups 28 present is approximately half that in the case of the occupation according to FIG. 4.

In the case of the occupation according to FIG. 4, the transfer facet groups 28 are predominantly rectangular.

In the case of the occupation according to FIG. 5, the transfer facet groups 28 deviate more often from the rectangular shape.

FIG. 6 shows a typical raw illumination of an illumination pupil 29 of the illumination optical assembly 11, which coincides with an entrance pupil of the projection optical assembly 10, and is arranged in a pupil plane 30 in the beam path of the illumination light 3 downstream of the object field 8 (cf. FIG. 1). The illustration shows a raw intensity distribution of the illumination light 3 over the pupil 29 before an illumination optimization for reducing an actual illumination intensity on the illumination predefinition facets 25. The pupil 29 is spanned by pupil dimensions $\sigma_x$, $\sigma_y$, assigned to the object field dimensions x, y.

FIG. 6 shows a y-dipole illumination setting having illumination poles 31 32. A degree of filling of the pupil 29 is given by the proportion of the total area of the pupil 29 that is made up of the areas of the two illumination poles 31, 32. In this case, the area delimited by an edge 33 of the respective illumination pole 31, 32 is used as area of the respective illumination pole 31, 32. The illumination poles 31, 32 each have a biconvex-lens-shaped cross section having a maximum $\sigma_y$-extension $\Sigma_y$ in the region of a central $\sigma_x$-coordinate of the pupil 29. In the region of this maximum extent $\Sigma_y$, approximately five pupil rods 34 arranged alongside one another along the $\sigma_y$-dimension contribute to the object field illumination.

FIG. 6 illustrates a scan-integrated illumination intensity within the illumination poles 31, 32. Consideration is given here to the illumination intensity which impinges on a specific point on the reticle 12 during a scan running in the y-direction through the object field 8. The y-direction is also designated as scan direction or as object displacement direction. This scan-integrated illumination intensity is distributed in the pupil 29 among pupil substructures or sub-pupil regions in the form of pupil rods 34 which have a larger extension in the pupil dimension $\sigma_y$ than in the pupil dimension $\sigma_x$. The extension of the pupil rods 34 in the pupil dimension $\sigma_y$ is dependent on the distance between the illumination predefinition facet mirror 7 and the pupil plane, that is to say the distance between the illumination predefinition facet mirror 7 and the entrance pupil of the projection optical assembly 10.

Between the pupil rods 34, the illumination light 3 does not impinge on the pupil 29, as seen from the direction of exactly one field height, that is to say from the direction of exactly x-coordinate of the object field 8. The scan-integrated illumination intensity is illustrated in FIG. 6 for that pupil 29 with which an object field point is impinged on which is scanned through the object field 8 in the y-direction with a fixed x-coordinate. For object field points along a cross-scan direction x, which therefore lie alongside one another along the x-direction in the object field 8 with a fixed y-coordinate, this results in a migration of the pupil rods 34 in the pupil dimension $\sigma_x$. If the pupil 29 is considered during a hypothetical migration in the object field 8 along the x-direction with a fixed y-coordinate, this results in a $\sigma_x$-migration of the pupil rods 34, the migration speed of which is dependent firstly on the x-migration speed in the object field 8 and secondly on the distance between the illumination predefinition facet mirror 7 and the pupil plane. In this case, arrangements can also be found in which such a "$\sigma_x$-migration" of the pupil rods 34 does not take place.

Each of the pupil rods 34 is illuminated via precisely one illumination light illumination channel to which exactly one transfer facet group 28 and exactly one illumination predefinition facet 25 belong. A $\sigma_x/\sigma_y$-grid arrangement of the pupil rods 34 in the pupil 29 corresponds to an x/y-grid arrangement of the illumination predefinition facets 25 on the illumination predefinition facet mirror 7.

In the case of the illumination of the pupil 29 according to FIG. 6, apart from the pupil rods 34 near the edges 33 of the illumination poles 31, 32, all pupil rods 34 in the direction of the $\sigma_y$-coordinate are of the same length.

FIG. 7 shows schematically a partial field 35, which is illuminated via an illumination channel of precisely one of the pupil rods 34. The partial field 35 has an x-extension of $x_{F1}$ and a y-extension of $y_{F1}$. The following holds true: $x_{F1} < x_0$ and $y_{F1} = y_0$. In the x-extension, therefore, the partial field 35 has a smaller extent than the object field 8. The extent of the partial field 35 in the scan direction y corresponds to the extent of the object field 8. Alternatively, the following can also hold true: $x_{F1} = x_0$.

The object field 8 is indicated in a dash-dotted manner in FIG. 7. A boundary of the partial field 35 within the object field 8 is illustrated in a dashed manner.

Those pupil rods 34 which near the edges 33 have a smaller $\sigma_y$-extension than the other pupil rods 34 belong to illumination channels which illuminate in the object field 8 partial fields whose y-extension at least for some sections of the illuminated partial field is smaller than the y-extension $y_0$ of the object field 8.

FIG. 8 shows an illumination of the illumination poles 31 and 32 which, proceeding from the illumination according to FIG. 6, is optimized for reducing the actual illumination intensity on the illumination predefinition facets 25. The area of the illumination pole 31 within the pupil 29 is larger in the case of the illumination according to FIG. 8 than in the case of the illumination according to FIG. 6. In the case of the illumination pupil 29 according to FIG. 8, the following holds true: $\Sigma_{y'} > \Sigma_y$.

In the region of the largest extension $\Sigma_{y'}$, in the case of the optimized pupil 29 according to FIG. 8, the number of illumination channels contributing to the illumination of the object field 8 is larger than in the region of the maximum extent $\Sigma_y$ of the raw pupil 29 according to FIG. 6.

In the region of the maximum extent $\Sigma_{y'}$, more than five pupil rods 34 arranged alongside one another in the $\sigma_y$-direction contribute to the object field illumination.

A $\sigma_y$-extent of the individual pupil rods 34 is smaller in the case of the pupil 29 according to FIG. 8 than in the case of the pupil 29 according to FIG. 6. Illumination channels which belong to pupil rods 34 of the pupil 29 according to FIG. 8 which have a maximum $\sigma_y$-extension contribute with partial fields to the object field illumination, for which a typical example is illustrated in FIG. 9.

A partial field 36 illustrated in FIG. 9 has an extension of $x_{F2}$ in the x-dimension and an extension of $y_{F2}$ in the y-extension. The following holds true: $x_{F2} < x_0$ and $y_{F2} < y_0$. In both dimensions x and y, therefore, the partial field 36 is smaller than the object field 8. Alternatively, the following can also hold true: $x_{F2} = x_0$. The y-extension of the partial fields which generate a pupil according to FIG. 8 is reduced by the same factor for all partial fields in comparison with the partial fields associated with FIG. 6.

The illumination light within the illumination pole 31 is therefore distributed among a larger number of shorter pupil rods 34 and thus among a larger number of illumination channels which illuminate smaller partial fields 36 of the object field 8 in the scan direction y. A degree of filling of the pupil is larger in the case of the pupil 29 according to FIG. 8 than in the case of the pupil 29 according to FIG. 6.

The illumination according to FIG. 9 can be chosen such that, for a plurality or for all of the illumination channels to which in each case complete transfer facet groups 28 belong, it holds true that an individual ratio $y_{F2}/y_0$ between the extent $y_{F2}$ of the illuminated partial field and the total extent $y_0$ of the object field 8 deviates by less than 20% from a mean ratio $(y_{F2}/y_0)_{mean}$—averaged for all the illumination channels—between the extent $y_{F2}$ of the illuminated partial field and the total extent $y_0$ of the object field 8. This deviation can also be less than 15%, can be less than 10%, can be less than 5%, or can be even smaller still.

Figure 10:
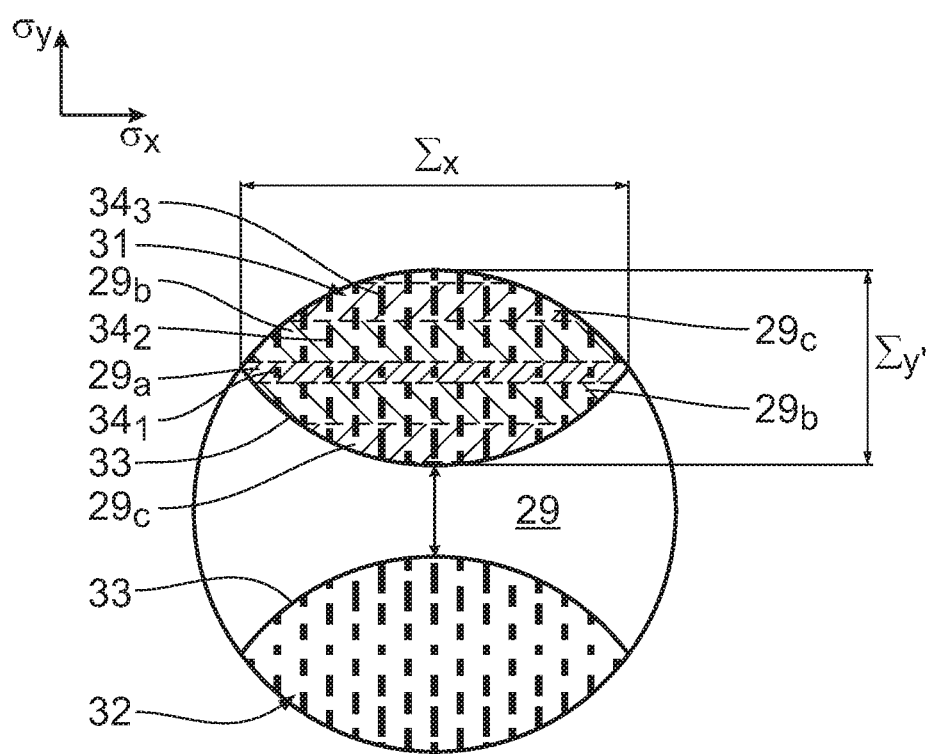
FIG. 10 shows, in an illustration similar to FIG. 6, an intensity distribution in the pupil of the illumination optical assembly, once again for a y-dipole, wherein within the individual poles, depending on the respective $\sigma_y$-coordinate of the pupil, the illumination predefinition facets illuminate different extensions of the object field in the scan direction.

FIG. 10 shows a further variant of an illumination of the pupil 29. In the case of this illumination, too, the illumination poles 31, 32 have a maximum extension of $\Sigma_{y'}$, in the $\sigma_y$-dimension, as in the case of the illumination pupil 29 according to FIG. 8. The pupil rods or subpupil regions 34 which are arranged in a manner lined up alongside one another in the $\sigma_x$-direction in the case of precisely one $|\sigma_y|$-value have identical $\sigma_y$-extensions. The pupil rods 34 which lie alongside one another along the $\sigma_y$-dimension in the case of precisely one $\sigma_x$-dimension have different $\sigma_y$-extensions. Different $\sigma_y$-extensions are fixedly assigned respectively to a $\sigma_y$-coordinate. Where the illumination poles 31, 32 have the maximum $\sigma_x$-extension $\Sigma_x$, the pupil rods $34_1$ have the smallest $\sigma_y$-extension. With increasing distance with respect to the $\sigma_y$-coordinate of the illumination poles 31, 32 with the maximum pole extension $\Sigma_x$, the $\sigma_y$-extension of the pupil rods 34 increases as long as the pupil rods 34 still lie completely within the illumination poles 31, 32.

Pupil rods $34_2$ adjacent to the pupil rods $34_1$ in the $\sigma_y$-coordinate have a somewhat greater extent than the pupil rods $34_1$ in the $\sigma_x$-extension. The in turn adjacent pupil rods $34_3$ have a maximum $\sigma_y$-extension. Depending on the $\sigma_y$-coordinate of their arrangement within the illumination poles 31, 32 the pupil rods 34 therefore contribute to the object field illumination with partial fields having different y-extensions. Those pupil rods $34_1$ in the region of the maximum $\sigma_x$-extension $\Sigma_x$ of the illumination poles 31, 32 illuminate parts of the object field 8 with a smaller extent in comparison with the total extent $y_0$ thereof in the scan direction y. This makes it possible to reduce the illumination light intensity per illumination channel.

The illumination poles 31, 32 can be subdivided into different pupil regions that differ with regard to their illumination intensity. This is illustrated for the illumination pole 31 in FIG. 10. A first illuminated pupil region 29a with a first, low illumination intensity is present in the region of central $\sigma_y$-values of the illumination pole 31. Marginally, that is to say in the case of high and in the case of low $\sigma_y$-values, further pupil regions 29b, 29c with in each case an illumination intensity that is higher than the illumination intensity in the central pupil region 29a are present in the illumination pole 31. The illumination intensities in the central pupil region 29a, on the one hand, and in the two marginal pupil regions 29b, 29c, on the other hand, differ by at least 20%.

The assignment of the illumination channels according to FIG. 10 is such that those virtual transfer facet groups 28 which illuminate the pupil regions 29a, 29b and 29c, for example, which are therefore situated perpendicularly to the object displacement direction at the same $\sigma_y$-coordinates, are designed for illuminating partial fields (cf. the partial fields 35, 36) having the same extension in the object displacement direction y.

Figure 11:
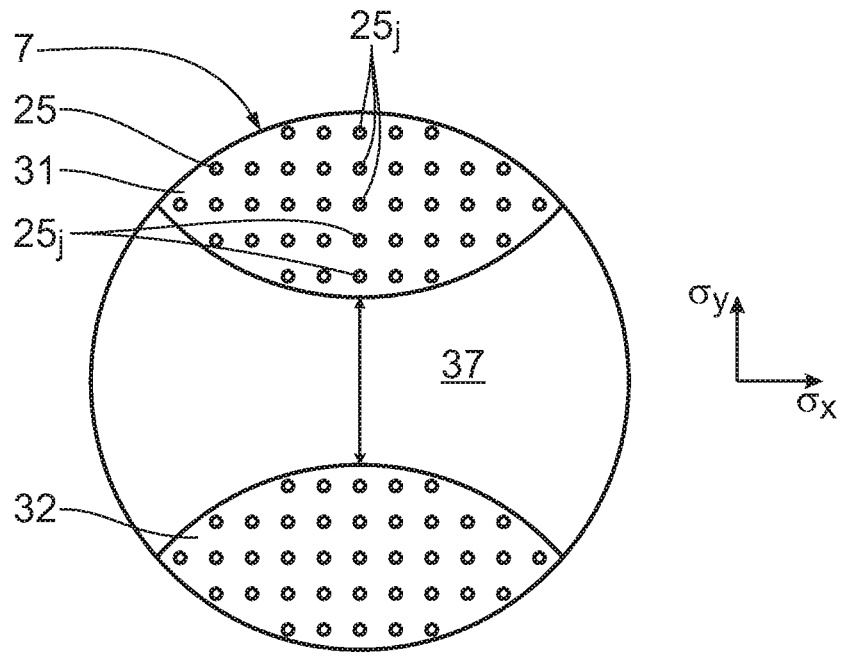
FIGS. 11 and 12 show plan views of an illumination predefinition facet mirror which is arranged in a pupil plane in the case of an alternative embodiment of the illumination optical assembly, wherein illuminations of a y-dipole are in each case illustrated and the illumination according to FIG. 11 exhibits a greater degree of filling of the pupil than the illumination according to FIG. 12.
Figure 12:
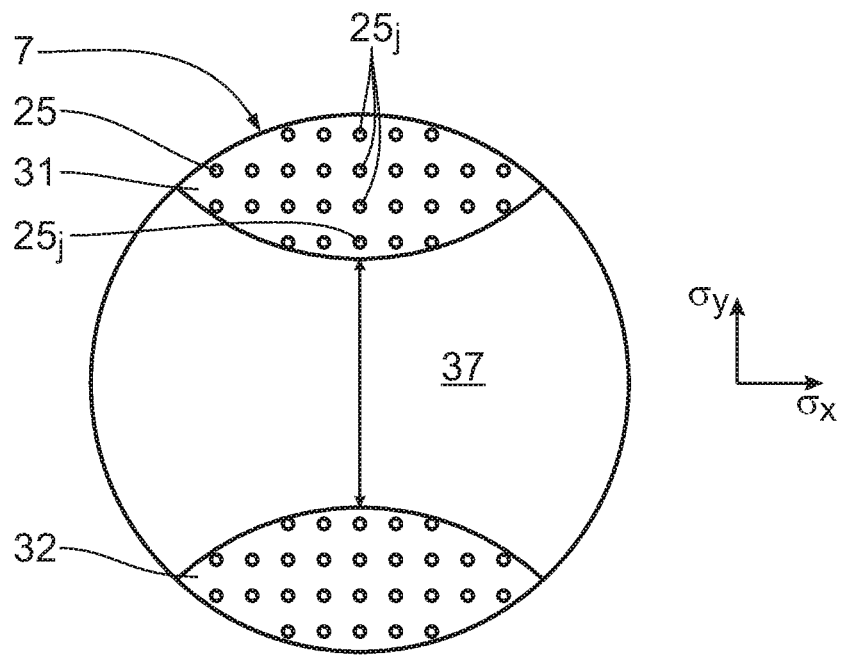

FIGS. 11 and 12 show, in a manner comparable to FIGS. 8 and 6, illumination pupils 37 for an embodiment of the illumination optical assembly 11 in which the illumination predefinition facet mirror 7 is arranged in a pupil plane of the illumination optical assembly 11, that is to say constitutes a pupil facet mirror. The illumination of the illumination pupil 37 according to FIGS. 11 and 12 arises directly as an illumination intensity distribution on the illumination predefinition facet mirror 7.

FIG. 11 shows a y-dipole illumination setting with a larger degree of filling of the pupil and FIG. 12 shows a y-dipole illumination setting with a smaller degree of filling of the pupil in comparison therewith. In the region of a maximum $\sigma_y$-extension, in the case of the illumination pupil 37 according to FIG. 11, the total of five illumination predefinition facets $25_j$ contribute to the object field illumination. In the case of the illumination pupil 37 according to FIG. 12, these facets are fewer, namely four illumination predefinition facets $25_j$. In the case of the illumination pupil 37 according to FIG. 11, therefore, overall more illumination channels contribute to the object field illumination, such that the illumination intensity on the individual illumination predefinition facets 25 is reduced in comparison with the illumination setting according to FIG. 12.

Figure 13:
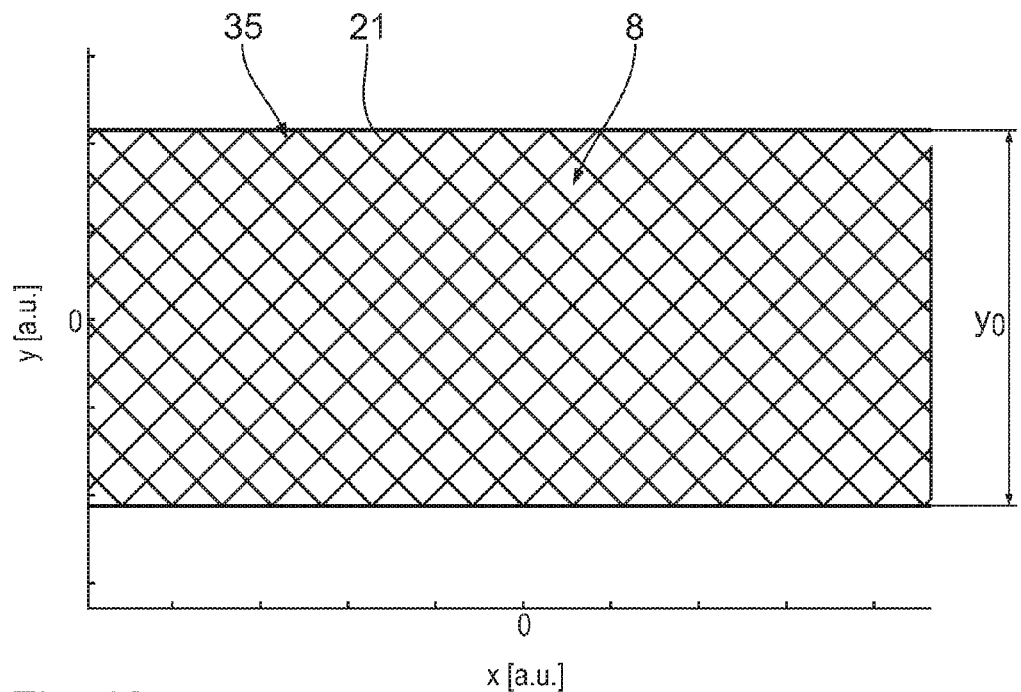
FIG. 13 shows a plan view of the object field, illuminated by partial fields which correspond to images of transfer facets of a transfer facet mirror of the illumination optical assembly.
Figure 14:
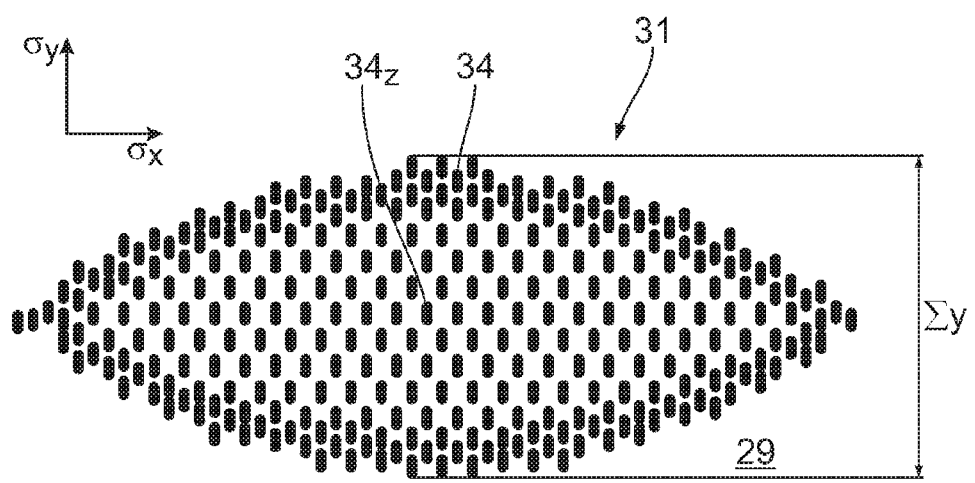
FIG. 14 shows, in an illustration similar to FIG. 6, a pole of a y-dipole illumination setting in a pupil plane of the illumination optical assembly, once again in a scan-integrated illustration.
Figure 15:
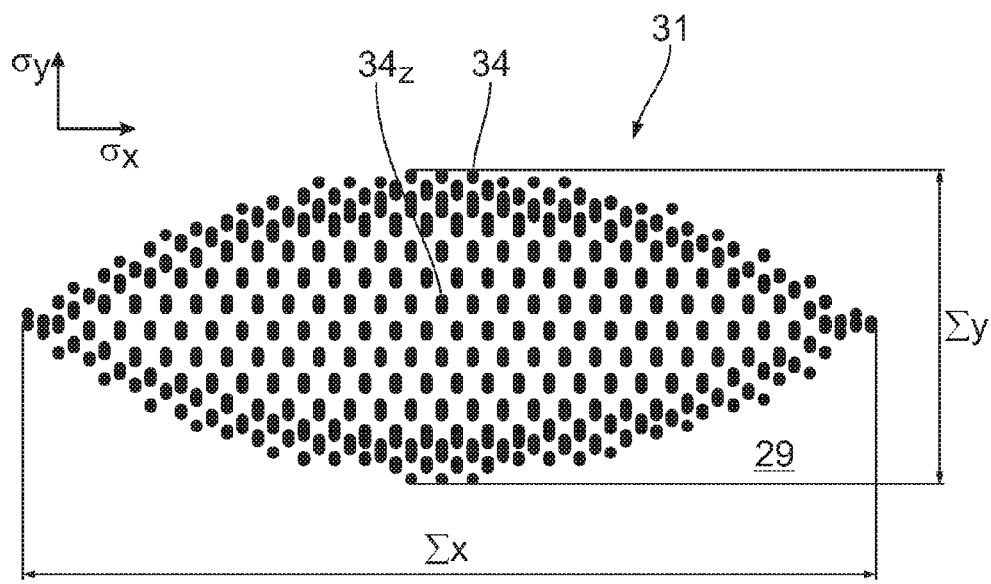
FIG. 15 shows, in an illustration similar to FIG. 14, an alternative illumination of a pole of a y-dipole illumination setting with a greater degree of filling of the pupil, wherein in a manner comparable to the illumination according to FIG. 10 depending on the pupil coordinate $\sigma_y$, illumination predefinition facets illuminate partial fields in the object field having different extensions along the scan direction y.

With reference to FIGS. 13 to 17, which are less schematic in comparison with FIGS. 6 to 10, an explanation is given below of further details of the intensity redistribution within an illumination pupil with use of a variant of the illumination optical assembly 11 with an arrangement of the illumination predefinition facet mirror 7 at a distance from a pupil plane. This is implemented on the basis of an illumination pole 31 within an illumination pupil 29 as illustrated in FIGS. 14 and 15.

In the case of the illumination pupil 29 according to FIG. 14, in the region of the maximum $\sigma_y$-extension $\Sigma_y$ of the illumination pole 31, six pupil rods 34 arranged in a $\sigma_x$-column contribute to the object field illumination. In the region of a maximum $\sigma_y$-pole extension $\Sigma_{y'}$, in the case of the illumination pupil 29 according to FIG. 15, a total of seven pupil rods 34 arranged in a $\sigma_x$-column contribute to the object field illumination.

FIG. 13 illustrates schematically an excerpt from the illumination of the rectangular object field 8 by images of the transfer facets 21. The illustration shows this illumination of the object field 8 via precisely one illumination channel, such that a structuring of the illumination in accordance with the transfer facet group 28 imaged onto the object field 8 and the subdivision into individual transfer facets 21 are discernible. FIG. 13 shows by way of example an object field illumination via an illumination channel which belongs to a central pupil rod 34z of the illumination pole 31 according to FIG. 14 and to a pupil rod 34 having a maximum $\sigma_y$-extension in the illumination pole 31 according to FIG. 15. A y-extension of this object field illumination according to FIG. 13 corresponds to the y-extent $y_0$ of the object field 8. For a field height, that is to say an x-coordinate of the object field 8, this complete object field illumination includes precisely seven images 21' of the transfer facets 21 lying one above another. In so far as the associated pupil rod 34z is illuminated by a transfer facet group 28 with maximum x-extension, the pupil rod 34 also contributes to the entire illumination of the object field 8 in the x-dimension.

The distribution of the pupil rods 34 according to FIG. 14 corresponds to that which has been explained above in association with FIG. 6. The degree of filling of the pupil in the case of the illumination pupil 29 according to FIG. 14 is the minimum achievable degree of filling of the pupil. All the pupil rods 34 have their maximum length along the $\sigma_y$-coordinate. Correspondingly, the associated illumination channels illuminate partial fields whose y-extension corresponds to the total extension $y_0$ of the object field 8.

Figure 16:
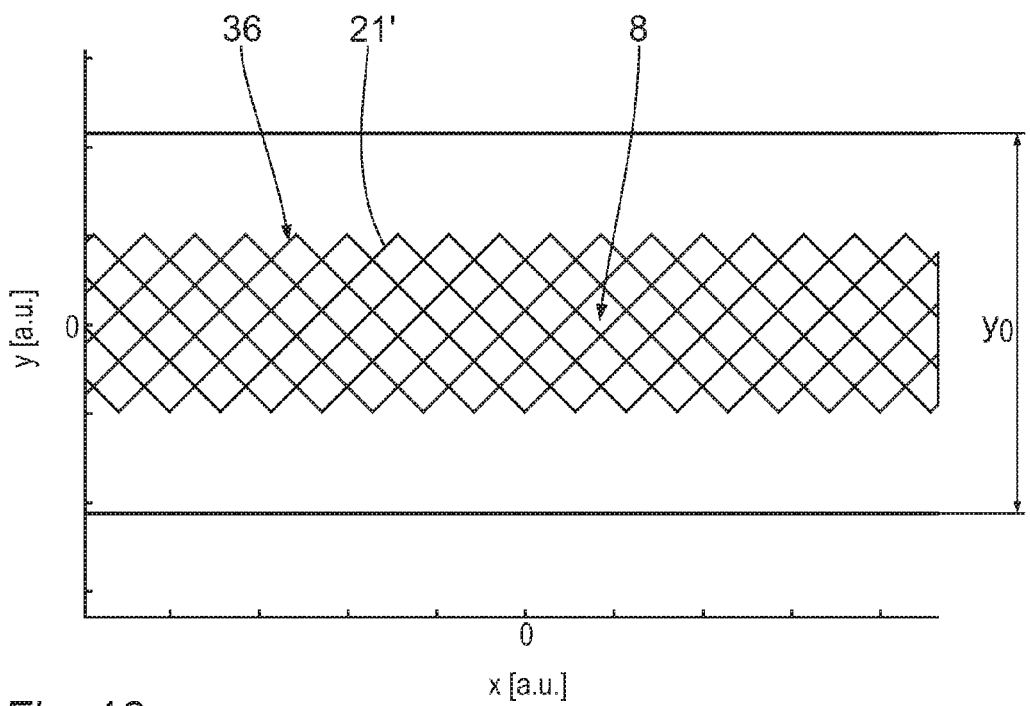
FIG. 16 shows, in an illustration similar to FIG. 13, an object field illumination by an illumination predefinition facet which, as seen in the dimension $\sigma_y$, is arranged centrally in the illumination pole according to FIG. 15 and illuminates only a partial field of the object field along the scan direction.

The illumination of the illumination pupil 29 according to FIG. 15 corresponds to that which has been explained above more highly schematically with reference to FIG. 10. Those pupil rods 34 which are arranged in the region of a maximum $\sigma_x$-extension $\Sigma_x$, that is to say the pupil rods $34_1$, belong to illumination channels which illuminate partial fields 36 in the object field 8, for which one exemplary partial field 36 is illustrated in FIG. 16. In a field height, that is to say in an x-coordinate of the object field 8, such a partial field includes precisely three images of the transfer facets 21 lying one above another. In comparison with the illumination according to FIG. 13, such a partial field illuminates 3/7 of the available scan length along the y-direction. This scan length reduction corresponds to a reduction of the thermal load on the illumination predefinition facet 25 associated with this illumination channel.

Figure 17:
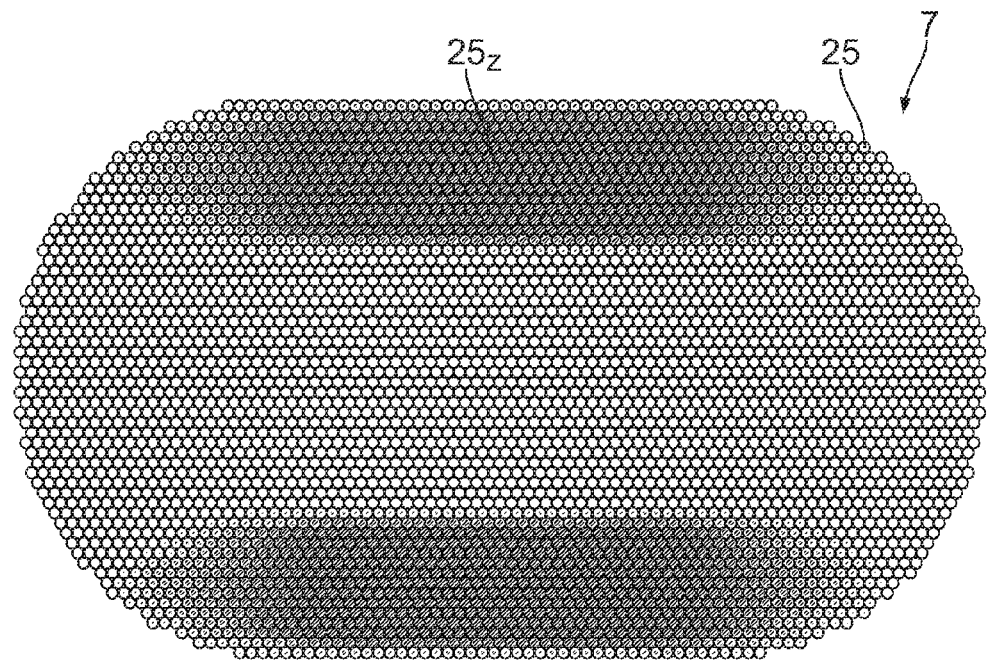
FIG. 17 shows a plan view of the illumination predefinition facet mirror—at a distance from the pupil plane of the illumination optical assembly—of the illumination optical assembly according to FIGS. 1 and 2 with an intensity impingement for the y-dipole illumination setting with two poles corresponding to the pole according to FIG. 15, wherein unilluminated illumination predefinition facets are illustrated as unfilled and in the illustration a degree of filling of illuminated illumination predefinition facets increases with the intensity loading.

FIG. 17 illustrates an assignment of the illumination predefinition facets 25 of the illumination predefinition facet mirror 7 to the y-extensions of the respective partial fields 35 and 36. The intensity loading of the respective illumination predefinition facet is symbolized by the diameter of a respective point on the illumination predefinition facet. Since the partial fields 35, 36 also differ in the x-dimension, despite identical $\sigma_y$-extensions of the pupil rods 34 with one and the same $\sigma_y$-coordinate this results in a variation of the illumination intensities of the illumination predefinition facets 25 which are arranged at the same y-coordinate. A maximum intensity loading on those illumination predefinition facets 25z which maximally illuminate the object field in the x-direction is effectively reduced on account of the reduced illumination in the y-direction (partial fields 36).

Figure 18:
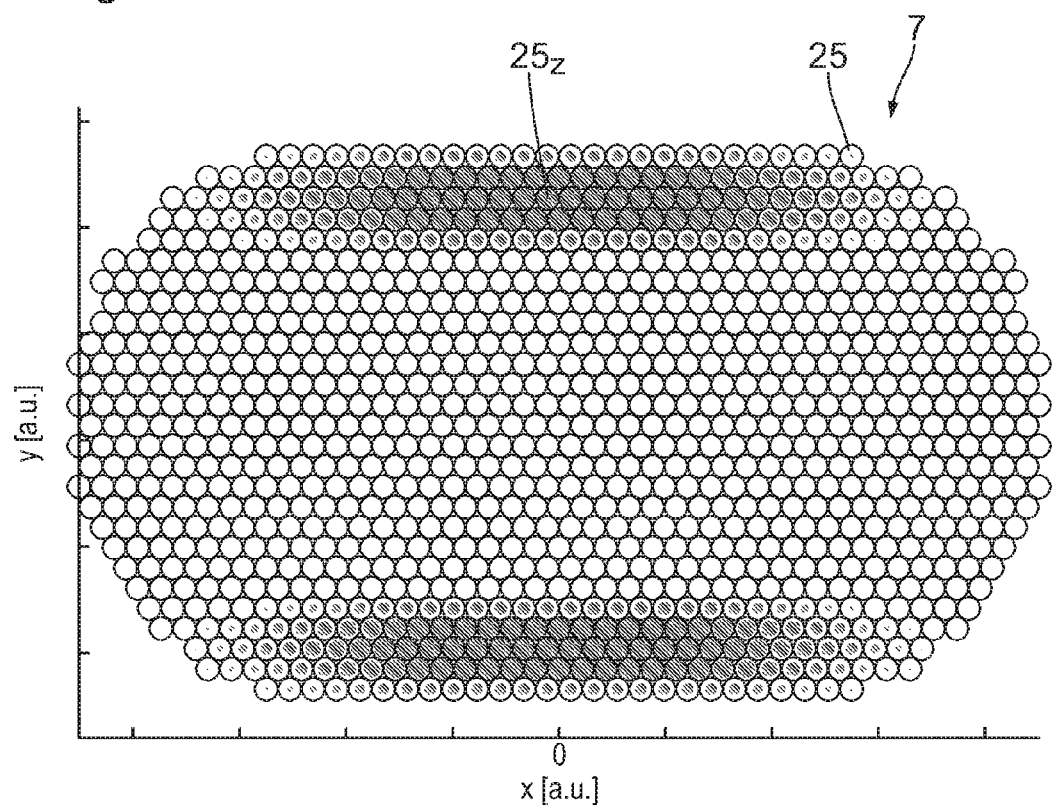
FIG. 18 shows, in an illustration similar to FIG. 17, the illumination predefinition facet mirror with an intensity impingement for an x-dipole illumination setting, wherein exclusively the illumination predefinition facets on which illumination light impinges are illustrated.
Figure 19:
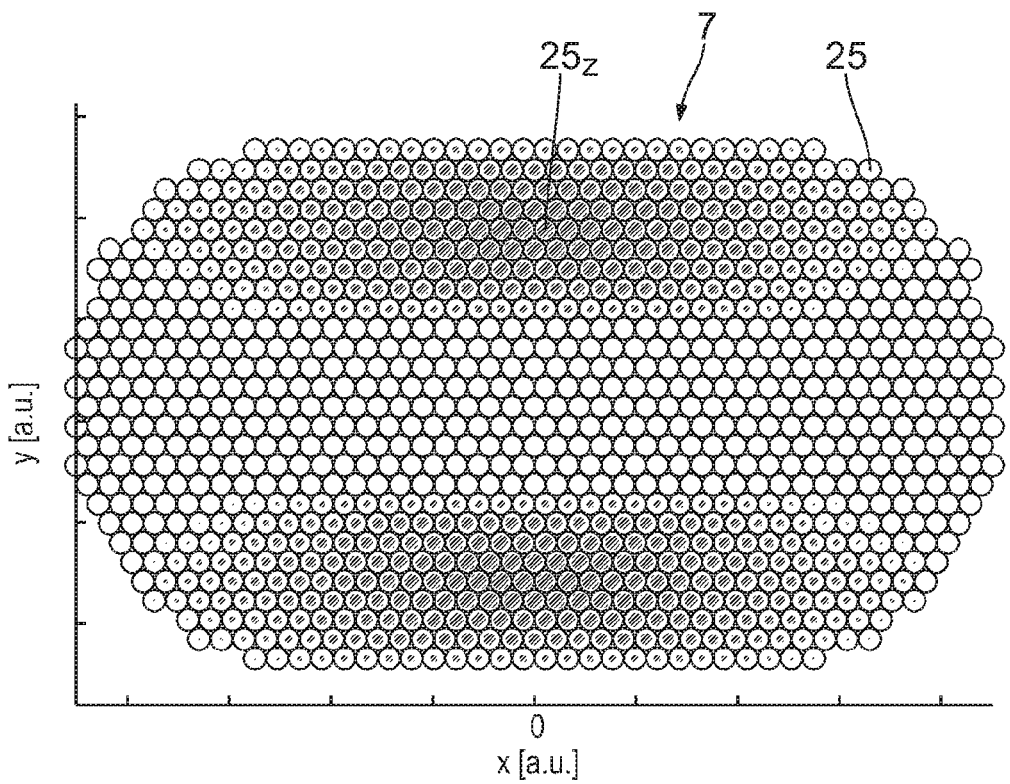
FIG. 19 shows, in an illustration similar to FIG. 18, a variant of the illumination of the illumination predefinition facets for a y-dipole illumination setting.

FIGS. 18 and 19 show, analogously to FIG. 17, an intensity loading of used illumination predefinition facets 25 which belong to an illumination predefinition facet mirror 7 which is arranged at a distance from a pupil plane, in the case of illumination of a y-dipole in the illumination pupil 29.

In this case, FIG. 18 shows the illumination including the intensity loading of illumination predefinition facets 25 before a reduction of the thermal load by reduction of the illumination in the y-direction via the partial field illumination and FIG. 19 shows the situation in the case of a reduction of the thermal load on the illumination predefinition facets 25. In the comparison between FIGS. 18 and 19, the maximum thermal load on account of the illumination intensity on the illumination predefinition facets 25 is reduced by approximately a factor of 2. The degree of filling of the pupil is enlarged in FIG. 19 in comparison with FIG. 18. The resulting y-illumination poles are enlarged in terms of their area in comparison with a minimum attainable degree of filling of the pupil. A maximum intensity loading is also reduced on the central illumination predefinition facets $25_z$ of the illumination predefinition facet mirror 7.

Figure 20:
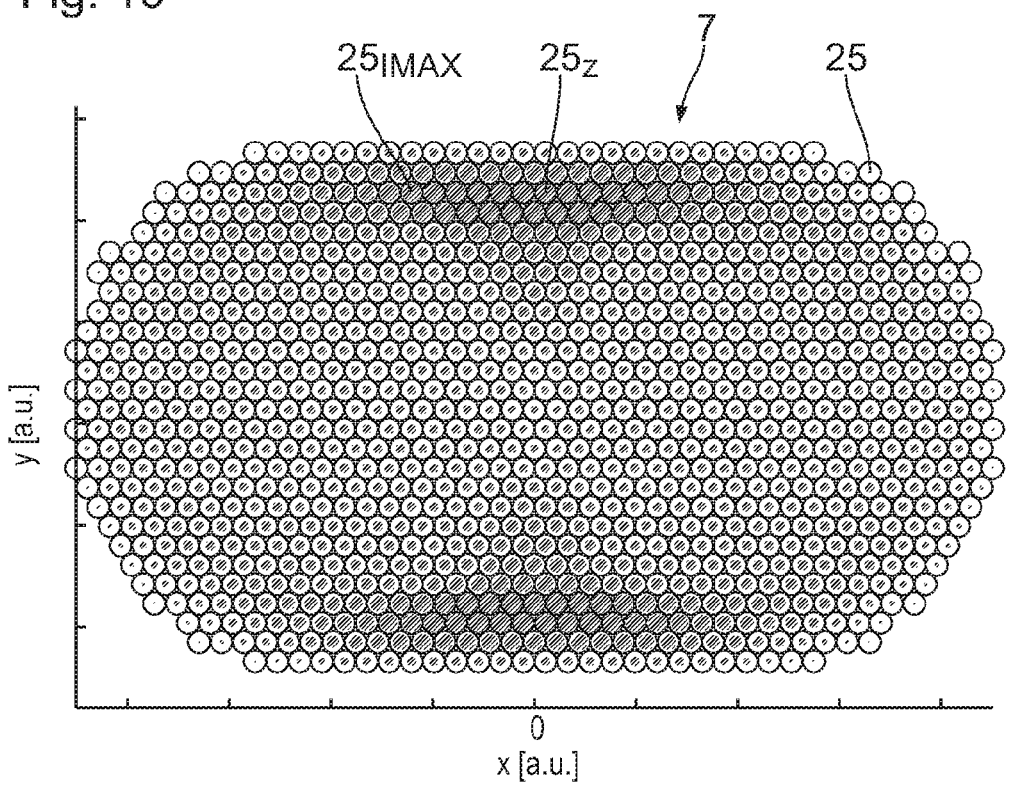
FIG. 20 shows, in an illustration similar to FIG. 18, an illumination of the illumination predefinition facets for an annular illumination setting.

FIG. 20 shows, in an illustration similar to FIGS. 18 and 19, the intensity loading of the illumination predefinition facets 25 in the case of an annular illumination setting, in which the object field points of the object field 8 are therefore illuminated from all possible illumination directions that are present above a first limit illumination angle and below a second, larger limit illumination angle. Here, too, a reduction of a thermal loading even of the most highly loaded illumination predefinition facets $25_{IMAX}$ results on account of the choice of a larger degree of filling of the pupil than the smallest possible degree of filling of the pupil.

Figure 21:
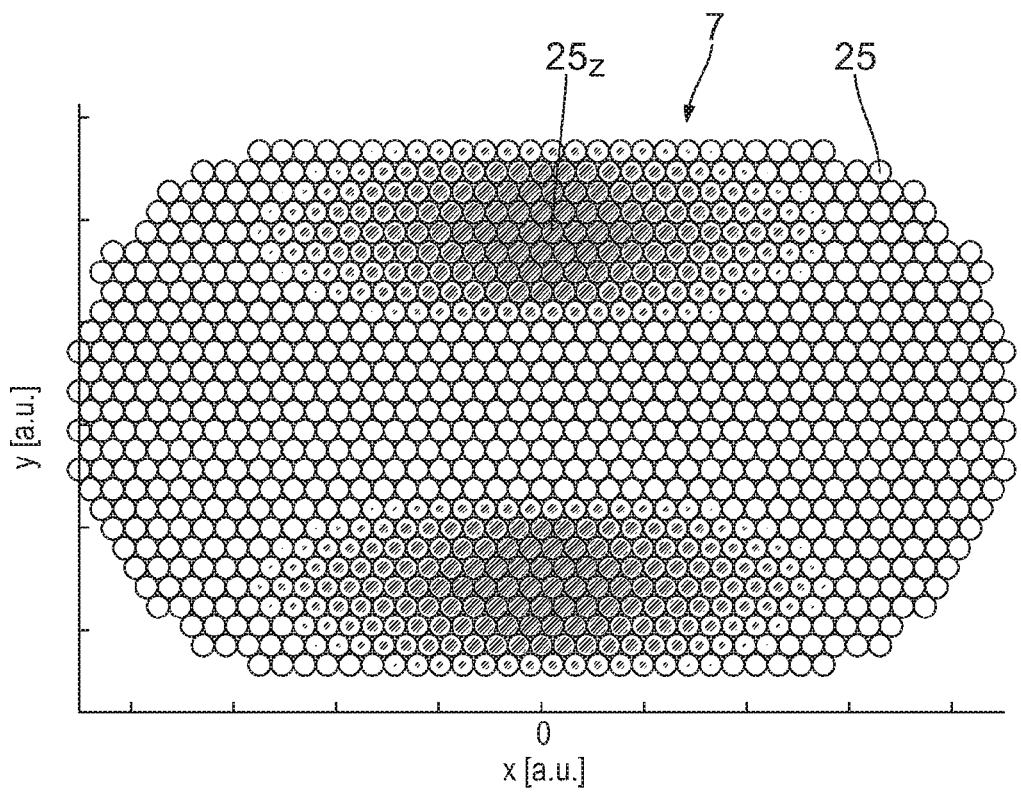
FIG. 21 shows, in an illustration similar to FIG. 19, an illumination of the illumination predefinition facets once again for a y-dipole illumination setting in the case of telecentric illumination of the object field.

FIG. 21 shows, in an illustration similar to FIGS. 18 to 20, the intensity loading of the illumination predefinition facets 25 in the case of a telecentric y-dipole illumination of the object field 8 corresponding to what has been explained above in particular in association with FIG. 2. Here, too, the choice of a lower degree of filling of the pupil than the maximum possible degree of filling of the pupil results in a lower intensity loading even of the maximally loaded central illumination predefinition facets 25z.

Figure 22:
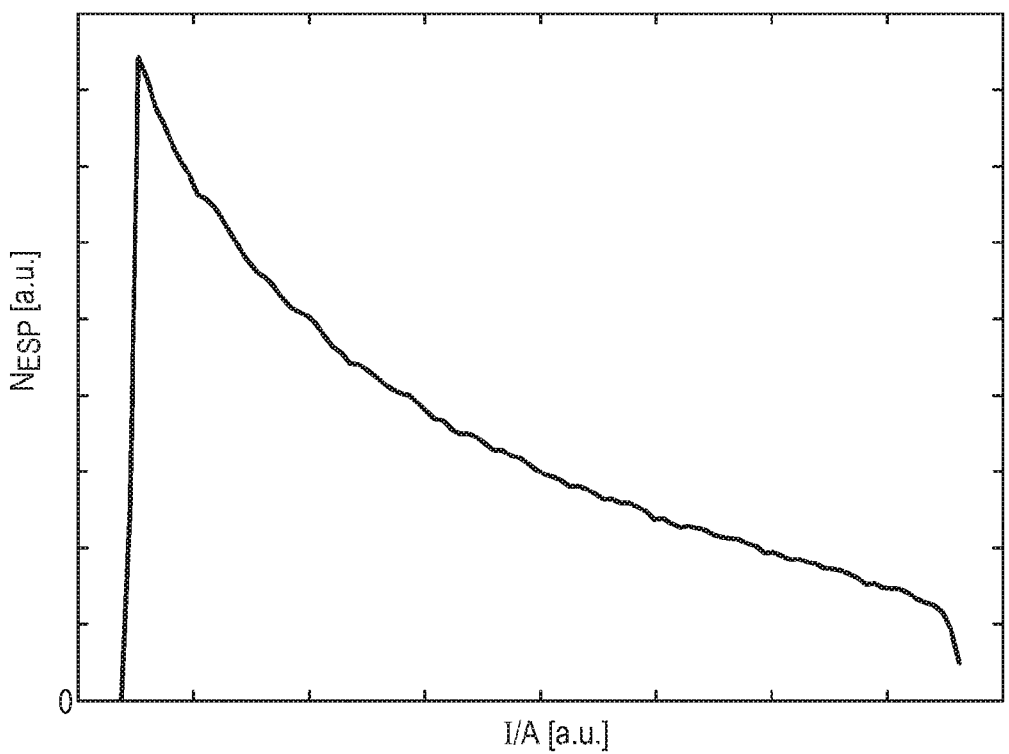
FIG. 22 shows a histogram of a distribution of intensities on individual mirrors of the transfer facet mirror.

FIG. 22 shows a frequency distribution of the numbers $N_{ESP}$ of the transfer facets 21 impinged on with specific intensities. The highest intensity I can differ from the lowest intensity A by more than a factor of 3. The frequency distribution shows a curve falling towards higher intensities. This means that in absolute terms the greatest number of transfer facets 21 is impinged on with in absolute terms the smallest intensities and towards higher intensities, the absolute number of the transfer facets 21 impinged on with this intensity falls virtually monotonically. By way of example, the number of transfer facets 21 impinged on with the highest intensity can be one fifth of those transfer facets 21 which are impinged on with the lowest intensity.

Figure 23:
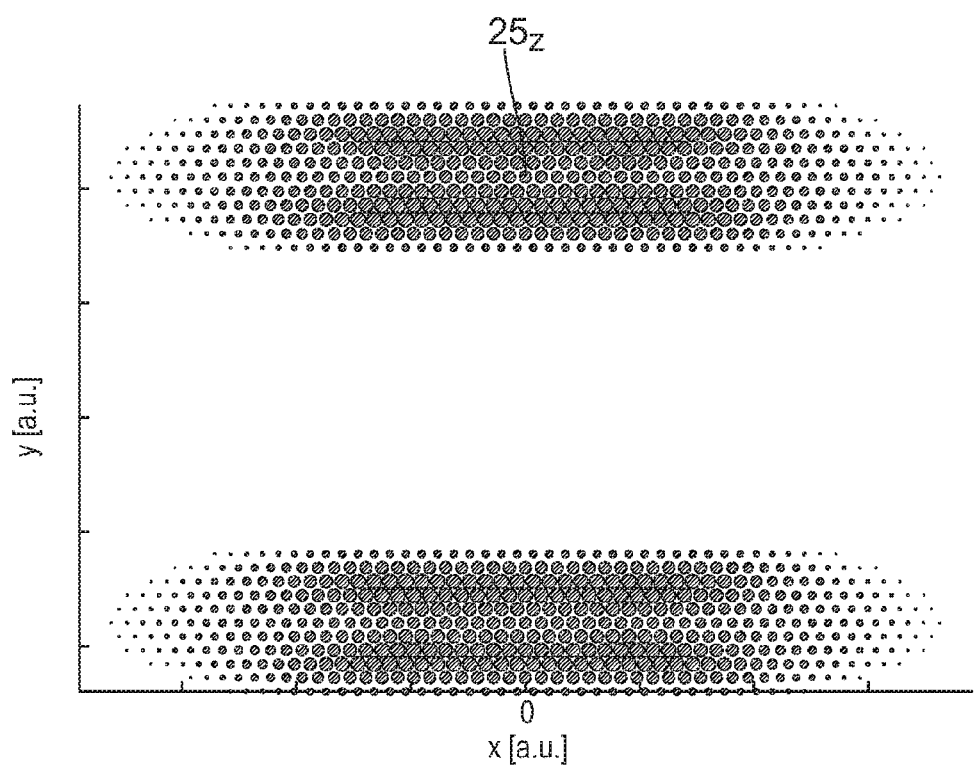
FIG. 23 shows, in an illustration similar to FIG. 19, an intensity distribution of an impingement on the illumination predefinition facets taking account of an intensity distribution on the transfer facet mirror according to FIG. 22.

FIG. 23 shows, in an illustration similar to FIG. 19, for example, a distribution of the intensity on the illumination predefinition facets 25, in the case of which the intensity variation according to FIG. 22 is used in such a way that a maximum intensity in particular on the central illumination predefinition facets 25z is reduced further. Where a maximum intensity impingement on the illumination predefinition facets 25z took place in FIG. 19, a transfer facet 21 assigned via the respective illumination channel is chosen which is impinged on by the light source 2 with a comparatively low intensity.

The assignment of the illumination predefinition facets 25 to the intensity distribution on the assigned transfer facet groups 28 can be such that transfer facet groups 28 which are illuminated with a lower intensity completely illuminate the object field 8 via the assigned illumination predefinition facet 25. Therefore, taking account of the intensity on the transfer facet groups 28, illumination channel assignments are possible in which the entire object field is illuminated via one and the same illumination predefinition facet 25, wherein a critical illumination intensity is then not exceeded on the illumination predefinition facet 25. In such cases, it can suffice if a plurality, but not all, of the illumination predefinition facets 25 illuminate only a partial field of the object field 8. In principle, however, it is also possible for actually all of the illumination predefinition facets 25 to illuminate their respective maximum partial field. In this case, in particular, a desired, minimum degree of filling of the pupil can be maintained.

Figure 24:
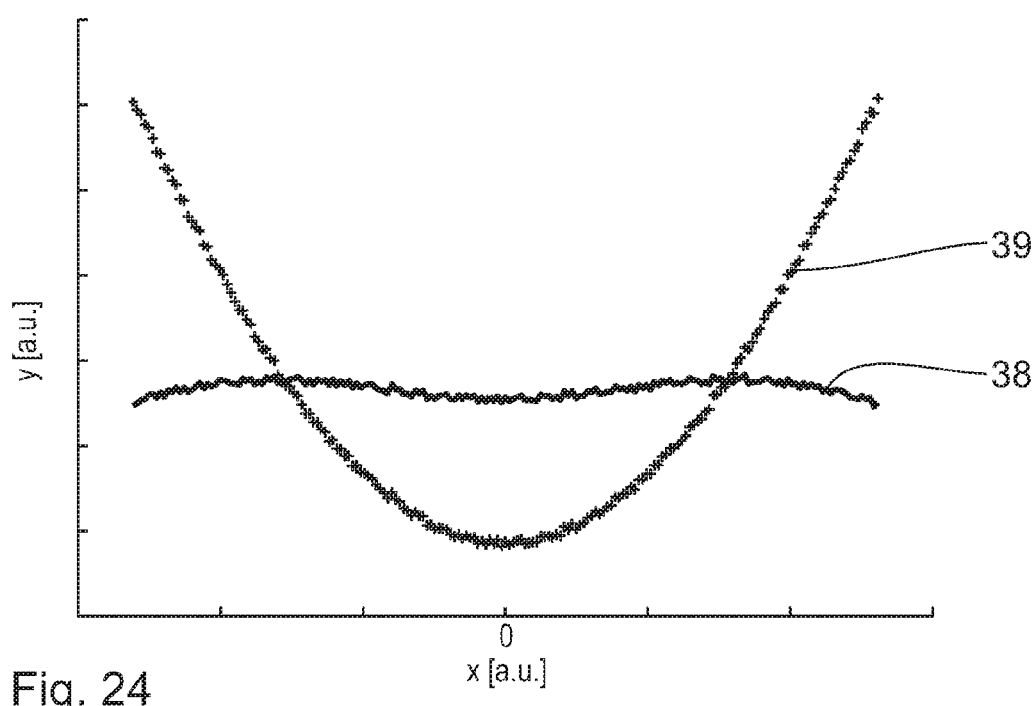
FIG. 24 shows an intensity profile on the object field against a field height perpendicular to the scan direction in the case of an impingement on the illumination predefinition facet mirror according to FIG. 23 and in the case of an impingement with a non-optimized intensity distribution on the illumination predefinition facets.

FIG. 24 shows an x-dependence of a scan-integrated illumination intensity over the object field 8 in the form of an intensity curve 38. In comparison with a non-optimized intensity curve 39, what is achieved in the case of the intensity distribution according to FIG. 23, for example, is that the scan-integrated intensity distribution has practically no dependence over the x-coordinate of the object field 8.

Figure 25:
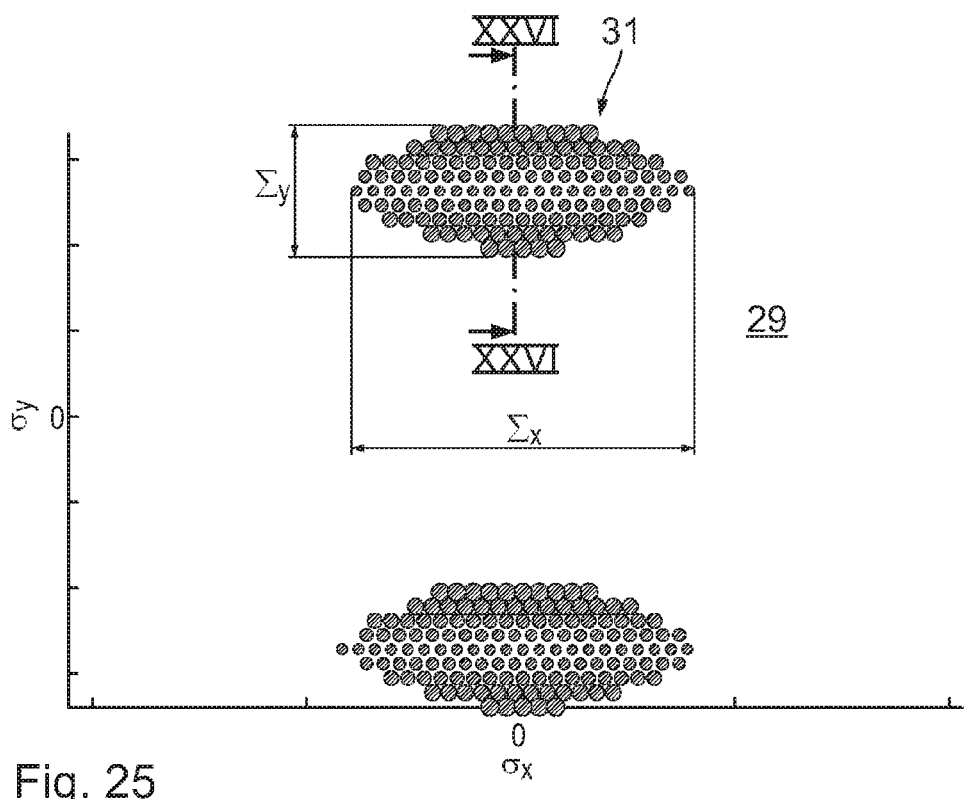
FIG. 25 shows an intensity distribution in a pupil plane of the illumination optical assembly, generated by an intensity impingement on the illumination predefinition facets according to FIG. 23.

FIG. 25 shows an illumination pupil 29 achieved with an intensity distribution on the illumination predefinition facets 25 according to FIG. 23. A y-dipole illumination setting results. FIG. 25 illustrates both an x-integrated and a y-scan-integrated pupil.

Figure 26:
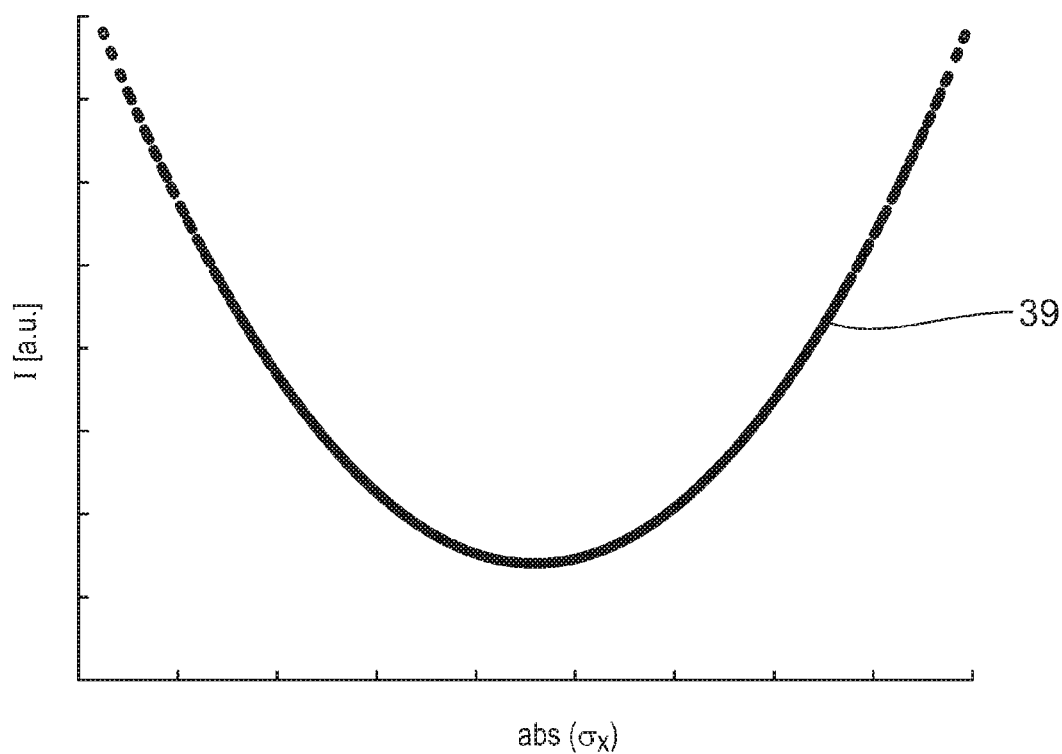
FIG. 26 shows a sectional view through the intensity profile according to FIG. 25 in accordance with the line XXVI-XXVI.

FIG. 26 shows a sectional view through the illumination pole 31 of the pupil 29 according to FIG. 25 in the region of the maximum $\sigma_y$-direction $\Sigma_y$. The result is an approximately parabolic intensity distribution 39 in dependence on the pupil coordinate $\sigma_y$. Where the $\sigma_x$-extension of the illumination pole 31 has the maximum value $\Sigma_x$, the intensity is minimal. Instead of identically reducing the scan length or rod length for all illumination channels with almost identical $\sigma_y$, as in FIGS. 10 and 15, here illumination predefinition facets 25 which illuminate the same $\sigma_y$-region are now illuminated by transfer facet groups 28 with almost identical intensity density. Both strategies lead to a reduction of the thermal load by generation of a systematic, fieldlocation-independent intensity profile in the pupil as a function of |σ_y|. The thermal load can, if desired, be reduced further by a combination of both strategies. It is furthermore possible to combine these two strategies with the global scan length reduction described above in association with FIG. 8.

A combination of two of these strategies described consists in reducing the scan length of a partial field of an illumination channel inversely proportionally to the intensity of the associated transfer facet group of the illumination channel. This reduces spikes in the thermal load and simultaneously homogenizes the pupil illumination. In the case of the embodiment in which the illumination predefinition facet mirror 7 is arranged at a distance from a pupil plane, an illumination intensity distribution in the pupil has along the scan direction y longer, less intensively illuminated pupil rods and in comparison therewith in the scan direction y shorter, more intensively illuminated pupil rods. An integral intensity of the individual rod-shaped subpupils and thus a thermal load on the illumination predefinition facets can be predefined as almost constant in the case of this combination.

Alternatively, if the illumination predefinition facet mirror 7 is situated in a pupil plane, then the result there is a regular arrangement of equally bright subpupils and a constant thermal load for the illumination predefinition facets 25.

Figure 27:
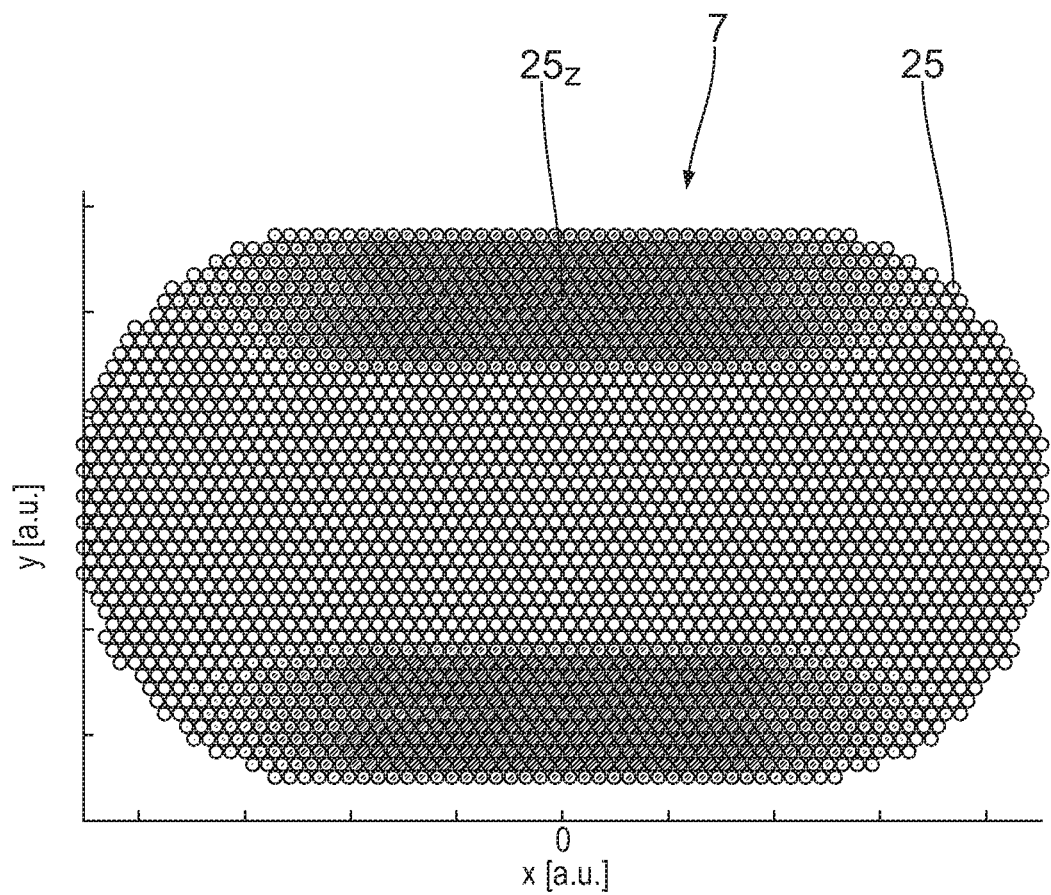
FIG. 27 shows, in an illustration similar to FIG. 23, a plan view of the entire illumination predefinition facet mirror including the illumination predefinition facets on which illumination light does not impinge.

FIG. 27 shows the intensity distribution on the illumination predefinition facets 25 according to FIG. 23. In contrast to FIG. 23, FIG. 27 also shows the other illumination predefinition facets 25 of the illumination predefinition facet mirror 7 on which the illumination light does not impinge.

For determining the above-described illumination intensity distributions within the pupil 29, that is to say for determining pupil regions which are illuminated with a predefined illumination intensity, the further procedure can be adopted:

Firstly, an illumination angle distribution desired for illuminating the object field 8 is predefined, that is to say a raw intensity distribution over the pupil 29, which is also designated as raw illumination setting. Afterwards, the pupil regions to be illuminated are identified, which form the raw illumination setting. In the case of a y-dipole setting, these are the illumination poles 31, 32, wherein the extensions $\Sigma_x$, $\Sigma_y$ do not yet have to be defined. Afterwards, an actual illumination intensity of the facets 21, 25 of the illumination optical assembly 11, in particular of the illumination predefinition facets 25 of the illumination predefinition facet mirror 7, for illuminating the identified pupil regions 31, 32 is ascertained. This actual illumination intensity is compared with a predefined maximum setpoint illumination intensity on the facets 21, 25. Afterwards, for example by enlargement of the degree of filling of the pupil, by variation of the intensity within the respective pupil region 29a, 29b, 29c or by redistribution of an assignment of transfer facets 21 to illumination predefinition facets 25 taking account of the illumination intensity on the transfer facets 21, a reduction of the actual illumination intensity on the facets 21, 25 and in particular on the illumination predefinition facets 25 is brought about where the actual illumination intensity is greater than the setpoint illumination intensity.

In order to produce a microstructured component, in particular a highly integrated semiconductor component, for example a memory chip, with the aid of the projection exposure apparatus 1, firstly the reticle 12 and the wafer 19 are provided. Afterwards, a structure on the reticle 12 is projected onto a light-sensitive layer on the wafer 19 via the projection optical assembly of the projection exposure apparatus 1. With the development of the light-sensitive layer, then a microstructure is produced on the wafer 19 and the micro- or nanostructured component is produced therefrom.

What is claimed is:

1. An illumination optical assembly configured to illuminate an object field with EUV illumination light, the illumination optical assembly comprising:
   a pupil illumination unit configured so that, during use of the illumination optical assembly, the EUV illumination light impinges on the pupil illumination unit, the pupil illumination unit comprising facets configured to guide illumination channels which are at least partly superimposed in the object field, the illumination channels illuminating a pupil with the EUV illumination light with a pupil intensity distribution,
   wherein:
   the pupil illumination unit is configured so that a plurality of illumination channels of the pupil illumination unit illuminate only a part of the entire object field;
   the facets of the pupil illumination unit are configured so that individual illumination channels of the pupil illumination unit only partly illuminate the object field along an object displacement direction in which an object is displaceable through the object field during the illumination;
   for at least some illumination channels, an extent of an illuminated partial field of the object field along the object displacement direction is less than a total extent of the object field along the object displacement direction;
   in the pupil, an illumination intensity profile is present which depends on an absolute value of a pupil coordinate corresponding to the object displacement direction;
   an illumination intensity of a first illuminated pupil region for a first absolute value of the pupil coordinate differs from an illumination intensity of a second illuminated pupil region for a second absolute value of the pupil coordinate by at least 20%; and
   the illumination optical assembly is a projection lithography illumination optical assembly.

2. An illumination optical assembly configured to illuminate an object field with EUV illumination light, the illumination optical assembly comprising:
   a pupil illumination unit configured so that, during use of the illumination optical assembly, the EUV illumination light impinges on the pupil illumination unit, the pupil illumination unit comprising facets configured to guide illumination channels which are at least partly superimposed in the object field, the pupil illumination unit configured to illuminate a pupil with the EUV illumination light with a predefined pupil intensity distribution,
   wherein:
   the pupil illumination unit is configured so that a plurality of illumination channels of the pupil illumination unit illuminate only a part of the entire object field;
   a size of a maximum partial field of the object field which is illuminatable by one of the illumination channels to predefine an illumination from directions that are within a desired illumination angle distribution is more than 10 times different from the sizes of the maximum partial fields which are assigned to the different illumination channels; and
   the illumination optical assembly is a projection lithography illumination optical assembly.

3. The illumination optical assembly of claim 2, wherein:
the facets of the pupil illumination unit are configured so that individual illumination channels of the pupil illumination unit only partly illuminate the object field along an object displacement direction in which an object is displaceable through the object field during the illumination;
for at least some illumination channels, the extent of the illuminated partial field of the object field along the object displacement direction is less than a total extent of the object field along the object displacement direction;
in the pupil, an illumination intensity profile is present which is dependent on an absolute value of a pupil coordinate corresponding to the object displacement direction; and
an illumination intensity of a first illuminated pupil region for a first absolute value of the pupil coordinate differs from an illumination intensity of a second illuminated pupil region for a second absolute value of the pupil coordinate by at least 20%.

4. The optical assembly of claim 2, wherein:
the pupil illumination unit comprises:
a first facet mirror comprising a multiplicity of individual mirrors which are individually tiltable; and
a further facet mirror comprising a plurality of individually tiltable facets arranged alongside each other to reflectively and superimposedly guide partial beams of a beam of the EUV illumination light to the object field;
the first facet mirror is arranged in or near a field plane that is conjugate with respect to the object field;
the further facet mirror is arranged a distance from a pupil plane of the illumination optical assembly; and
the facets of the first configured to illuminate in each case a further facet of the further facet mirror are groupable to form virtual facets groups.

5. The illumination optical assembly of claim 2, wherein:
the pupil illumination unit comprises:
a first facet mirror comprising a multiplicity of individual mirrors, which are individually tiltable; and
a pupil facet mirror comprising a plurality of pupil facets arranged alongside each other to reflectively and superimposedly guide beams of a beam of the EUV illumination light to the object field;
the pupil facet mirror is arranged in a pupil plane of the illumination optical assembly so that a position of the respective pupil facet on the pupil facet mirror predefines an illumination direction for the field points of the object field; and
the facets of the first facet mirror to illuminate in each case a pupil facet are groupable to form virtual first facet groups.

6. The illumination optical assembly of claim 5, wherein the virtual facet groups are configured to illuminate partial fields, the extension of at least some of the partial fields in the object displacement direction is less than the extension of the entire object field in the object displacement direction.

7. The illumination optical assembly of claim 6, wherein the virtual facet groups are configured to illuminate partial fields whose extension in the object displacement direction differs by more than 20%.

8. The illumination optical assembly of claim 7, wherein those virtual facet groups which illuminate regions of the illumination pupil which are situated perpendicularly to the object displacement direction at the same coordinate in the pupil are configured to illuminate partial fields having the same extension in the object displacement direction.

9. The illumination optical assembly of claim 4, wherein the virtual facet groups are configured to illuminate partial fields, the extension of at least some of the partial fields in the object displacement direction is less than the extension of the entire object field in the object displacement direction.

10. The illumination optical assembly of claim 9, wherein the virtual facet groups are configured to illuminate partial fields whose extension in the object displacement direction differs by more than 20%.

11. The illumination optical assembly of claim 10, wherein those virtual facet groups which illuminate regions of the illumination pupil which are situated perpendicularly to the object displacement direction at the same coordinate in the pupil are configured to illuminate partial fields having the same extension in the object displacement direction.

12. The illumination optical assembly of claim 2, wherein the pupil illumination unit is configured so that different pupil intensity distributions over the pupil result for different field points of the object field.

13. The optical assembly of claim 12, wherein:
the pupil illumination unit comprises:
a first facet mirror comprising a multiplicity of individual mirrors which are individually tiltable; and
a further facet mirror comprising a plurality of individually tiltable facets arranged alongside each other to reflectively and superimposedly guide partial beams of a beam of the EUV illumination light to the object field;
the first facet mirror is arranged in or near a field plane that is conjugate with respect to the object field;
the further facet mirror is arranged a distance from a pupil plane of the illumination optical assembly; and
the facets of the first configured to illuminate in each case a further facet of the further facet mirror are groupable to form virtual facets groups.

14. The illumination optical assembly of claim 12, wherein:
the pupil illumination unit comprises:
a first facet mirror comprising a multiplicity of individual mirrors, which are individually tiltable; and
a pupil facet mirror comprising a plurality of pupil facets arranged alongside each other to reflectively and superimposedly guide beams of a beam of the EUV illumination light to the object field;
the pupil facet mirror is arranged in a pupil plane of the illumination optical assembly so that a position of the respective pupil facet on the pupil facet mirror predefines an illumination direction for the field points of the object field; and
the facets of the first facet mirror to illuminate in each case a pupil facet are groupable to form virtual first facet groups.

15. An optical system, comprising:
an illumination optical assembly according to claim 2; and
a projection optical assembly configured to image the object field into an image field.

16. An illumination system, comprising:
an illumination optical assembly according to claim 2; and
an EUV light source.

17. An apparatus, comprising:
an illumination optical assembly according to claim 2;
a projection optical assembly configured to image the object field into an image field; and an EUV light source, wherein the apparatus is a projection exposure apparatus.

18. A method of using a projection exposure apparatus comprising an illumination optical assembly and a projection optical assembly, the method comprising:
- using the illumination optical assembly to illuminate at least a section of a reticle; and
- using the projection optical assembly to project the illumination section of the reticle onto an EUV light sensitive material,
- wherein the illumination optical assembly comprises the illumination optical assembly of claim 2.

19. An illumination optical assembly configured to illuminate an object field with EUV illumination light, the illumination optical assembly comprising:
- a pupil illumination unit configured so that, during use of the illumination optical assembly, the EUV illumination light impinges on the pupil illumination unit, the pupil illumination unit comprising facets configured to guide illumination channels which are at least partly superimposed in the object field, the pupil illumination unit configured to illuminate a pupil with the EUV illumination light with a predefined pupil intensity distribution, wherein:
- the pupil illumination unit is configured so that a plurality of illumination channels of the pupil illumination unit illuminate only a part of the entire object field;
- the facets of the pupil illumination unit are configured so that individual illumination channels of the pupil illumination unit only partly illuminate the object field along an object displacement direction in which an object is displaceable through the object field during the illumination;
- for each of illumination channel, an extent of an illuminated partial field of the object field along the object displacement direction is smaller than a total extent of the object field along the object displacement direction;
- for a plurality of the illumination channels, an individual ratio between the extent of the illuminated partial field and the total extent of the object field along the object displacement direction deviates by less than 20% from a mean ratio, averaged for all of the illumination channels, between the extent of the illuminated partial field and the total extent of the object field along the object displacement direction; and
- the illumination optical assembly is a projection lithography illumination optical assembly.

20. A method, comprising:

providing the illumination optical assembly according to claim 2;

predefining an illumination angle distribution desired for illuminating the object field;

identifying pupil regions to be illuminated which form a raw intensity distribution;

ascertaining an actual illumination intensity of the facets of the pupil illumination unit for illuminating the identified pupil regions;

comparing the actual illumination intensity with a maximum setpoint illumination intensity; and reducing the actual illumination intensity on the facets where the actual illumination intensity is greater than the maximum setpoint illumination intensity.

* * * * *

UNITED STATES PATENT AND TRADEMARK OFFICE
CERTIFICATE OF CORRECTION

PATENT NO. : 9,915,875 B2
APPLICATION NO. : 15/439616
DATED : March 13, 2018
INVENTOR(S) : Martin Endres It is certified that error appears in the above-identified patent and that said Letters Patent is hereby corrected as shown below:

In the Specification

Column 6, Line 43: Delete "an in particular" and insert -- in particular a --, therefor.

Column 8, Line 21: Delete "an in particular" and insert -- in particular --, therefor.

Signed and Sealed this
Twenty-ninth Day of May, 2018

Andrei Iancu
*Director of the United States Patent and Trademark Office*